United States Patent
Chung et al.

(10) Patent No.: US 9,059,738 B2
(45) Date of Patent: Jun. 16, 2015

(54) METHOD OF READING DATA FROM STORAGE DEVICE, ERROR CORRECTION DEVICE AND STORAGE SYSTEM INCLUDING ERROR CORRECTION CODE DECODER

(75) Inventors: Biwoong Chung, Yongin-si (KR); Junjin Kong, Yongin-si (KR); Namshik Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 13/601,057

(22) Filed: Aug. 31, 2012

(65) Prior Publication Data

US 2013/0173985 A1  Jul. 4, 2013

(30) Foreign Application Priority Data

Dec. 30, 2011 (KR) .................. 10-2011-0146645

(51) Int. Cl.
  *H03M 13/00* (2006.01)
  *H03M 13/11* (2006.01)
  *G06F 11/10* (2006.01)

(52) U.S. Cl.
  CPC ....... *H03M 13/1111* (2013.01); *G06F 11/1012* (2013.01)

(58) Field of Classification Search
  USPC ........................................ 714/755
  See application file for complete search history.

(56) References Cited

U.S. PATENT DOCUMENTS

| 7,398,453 | B2 | 7/2008 | Yu |
| 7,707,482 | B2 | 4/2010 | Chung |
| 7,904,793 | B2 | 3/2011 | Mokhlesi et al. |
| 2008/0250300 | A1* | 10/2008 | Mokhlesi et al. ............. 714/780 |
| 2009/0125787 | A1* | 5/2009 | Sakimura et al. ............. 714/764 |
| 2011/0083060 | A1* | 4/2011 | Sakurada et al. ............. 714/763 |
| 2012/0054580 | A1* | 3/2012 | Sakaue ........................ 714/763 |

FOREIGN PATENT DOCUMENTS

KR  100738983 B1  7/2007

OTHER PUBLICATIONS

Author: Ta-Hsiang Hu and Shu Lin; Title: An Efficient Hybrid Decoding Algorithm for Reed—Solomon Codes Based on Bit Reliability; Publisher : IEEE vol. 51, No. 7; Date Jul. 2003.*
Author: Raman Yazdani, Student Member, IEEE, and Masoud Ardakani, Member, IEEE; Title: Linear LLR Approximation for Iterative Decoding on Wireless Channels; Publisher/Date: IEEE Transactions on Communications, vol. 57, No. 11, Nov. 2009.*

* cited by examiner

*Primary Examiner* — April Y Blair
*Assistant Examiner* — Thien D Nguyen
(74) *Attorney, Agent, or Firm* — Harness, Dickey & Pierce, P.L.C.

(57) ABSTRACT

Methods of reading data from storage devices may include reading data stored in the storage device using normal read voltages; performing a first low density parity check (LDPC) decoding based on the read data; generating reliability bits of each of read bits according to the decoding result, the read bits being bits of the read data; and performing a second low density parity check (LDPC) decoding based on the read data and the reliability bits to perform a first error correction on the read data.

17 Claims, 27 Drawing Sheets

| Read & Reliability Bits | Initial LLR |
|---|---|
| 000 | M1 |
| 001 | M2 |
| 010 | M3 |
| 011 | M4 |
| 100 | M5 |
| 101 | M6 |
| 110 | M7 |
| 111 | M8 |

METHOD OF READING DATA FROM STORAGE DEVICE, ERROR CORRECTION DEVICE AND STORAGE SYSTEM INCLUDING ERROR CORRECTION CODE DECODER

CROSS-REFERENCE TO RELATED APPLICATIONS

This U.S. non-provisional patent application claims priority under 35 U.S.C. §119 of Korean Patent Application No. 10-2011-0146645, filed on Dec. 30, 2011, the entire contents of which are hereby incorporated by reference.

BACKGROUND

Example embodiments relates to methods of reading data from storage devices, error correction devices and storage systems including the error correction device.

Semiconductor memory devices are memory devices embodied using semiconductors such as silicon Si, germanium Ge, gallium arsenide CaAs, indium phosphide InP. Semiconductor memory devices can be roughly divided into two categories including volatile memory devices and non-volatile memory devices.

Volatile memory devices lose stored data when disconnected from power. Examples of volatile memory devices include static random access memory (SRAM), dynamic random access memory (DRAM) and synchronous DRAM (SDRAM). Nonvolatile memory devices maintain stored data even when disconnected from power. Examples of nonvolatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM) and ferroelectric RAM (FRAM).

When data programmed in a memory device is read, errors may occur. If errors occur when reading data, errors may be included in the read data. To correct errors of the read data, error correction codes such as Bose-Chaudhuri-Hocquenghem (BCH) code, Reed-Solomon (RS) code, Low Density Parity Check (LDPC) code, Tutbo code are being studied.

SUMMARY

Example embodiments may provide a method of reading data from a storage device. The method may include reading data stored in the storage device using normal read voltages; performing a first low density parity check (LDPC) decoding based on the read data and generating reliability bits of each of read bits according to the decoding result, the read bits being bits of the read data; and performing a second LDPC decoding based on the read data and the reliability bits to perform a first error correction on the read data.

Example embodiments may also provide an error correction device. The error correction device may include a memory configured to store first data received from an external device, store reliability data indicating reliabilities of the first data, and output the received data and the reliability data; a log-likelihood ratio mapper configured to output first mapped data by mapping first log-likelihood ratios to the first data output from the memory and output second mapped data by mapping second log-likelihood ratios to the first data and reliability data output from the memory; a decision unit configured to perform a low density parity check decoding on the basis of the first mapped data or the second mapped data; and a log-likelihood ratio reliability updater configured to receive a decoding result based on the first mapped data from the decision unit, compare the decoding result with the read data stored in the memory and generate the reliability data indicating reliability of each bit of the read data according to the comparison result to store the generated reliability data on the memory.

Example embodiments may also provide a storage system. The storage system may include a storage device; and a controller configured to receive first data read from the storage device, the controller including an error correction code decoder correcting an error of the received first data. The error correction code decoder includes a memory configured to store the read data and reliability data indicating reliabilities of the first data, and to output the read data and reliability data; a log-likelihood ratio mapper configured to map first log-likelihood ratios to the first data output from the memory to output first mapped data and map second log-likelihood ratios to the first data and the reliability data output from the memory to output second mapped data; a decision unit configured to perform a low density parity check (LDPC) decoding based on of the first mapped data or the second mapped data; and a log-likelihood ratio reliability updater configured to receive a first decoding result based on the first mapped data from the decision unit, compare the first decoding result with the first data stored in the memory and generate the reliability data indicating reliability of each bit of the first data according to the comparison result to store the generated reliability data on the memory. The log-likelihood ratio reliability updater is configured to correct an error of the read data on the basis of the second decoding result according to the second mapped data.

Example embodiments may also provide a method of reading data from a storage device including performing a hard decision reading operation to generate hard decision data, the hard decision reading operation including, reading data stored in the storage device using first read voltages, generating a plurality of reliability bits corresponding to each of a plurality of read bits by performing a decoding operation based on the read data, the read bits being bits of the read data, and performing a first error correction operation on the read data based on the read data and the reliability bits; generating a comparison result based on the hard decision data; and determining whether to perform a soft decision reading operation on the data stored in the storage device using fractional read voltages different than the first read voltages, based on the comparison result.

BRIEF DESCRIPTION OF THE FIGURES

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 8 illustrates factor graphs for describing an initialization step of FIG. 7.

FIG. 10 illustrates a process in which check nodes are updated.

FIG. 20 illustrates an example of mapped information stored in hard decision log-likelihood ratio (LLR) register.

DETAILED DESCRIPTION OF THE EMBODIMENTS

Figure 1:
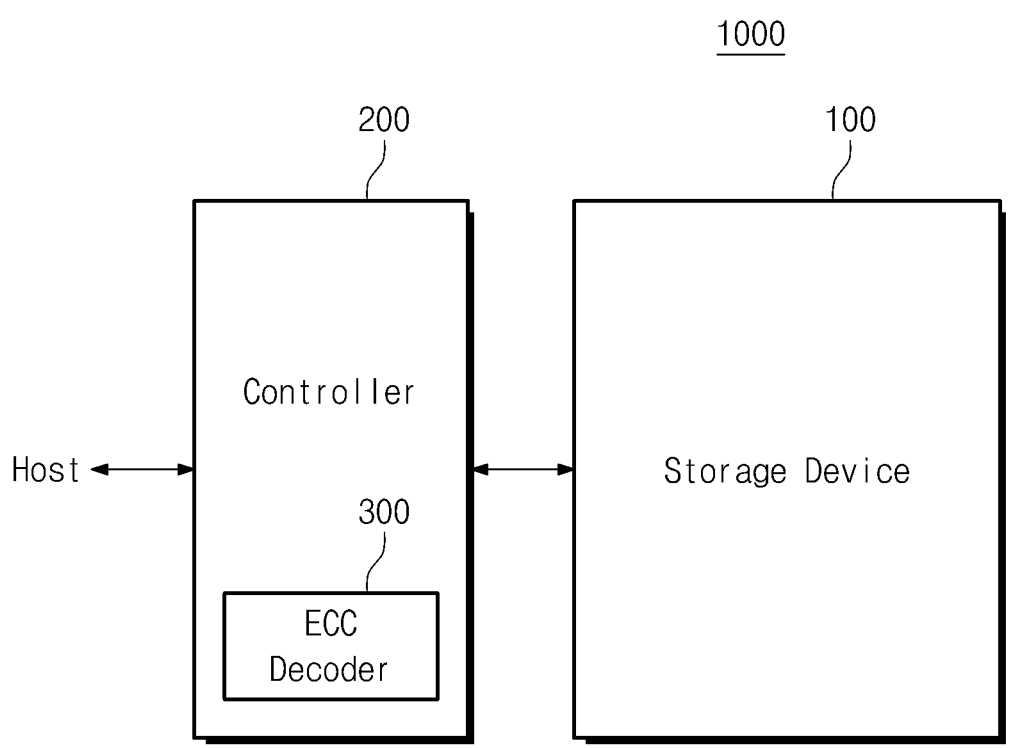
FIG. 1 is a block diagram illustrating a storage system in accordance with at least some example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram illustrating a storage system 1000 in accordance with at least some example embodiments. Referring to FIG. 1, the storage system 1000 includes a storage device 100 and a controller 200. The storage device 100 includes a flash memory. That is, the storage device 100 stores data by controlling a threshold voltage of memory cells.

The controller 200 is connected to a host and the storage device 100. In response to a request from the host, the controller 200 is configured to access the storage device 100. The controller 200 is configured to control read, write, erase and background operations of the storage device 100. The controller 200 is configured to provide an interface between the storage device 100 and the host. The controller 200 is configured to drive a firmware for controlling the storage device 100.

The controller 200 is configured to provide a control signal and an address to the storage device 100. The controller 200 is configured to exchange data with the storage device 100.

The controller 200 includes an error correction code decoder 300. The error correction code decoder 300 performs a decoding operation on data read from the storage device 100 using an error correction code (ECC). The error correction code decoder 300 performs a decoding operation to correct errors of read data. The error correction code decoder 300 performs a decoding operation using a low density parity check (LDPC) code.

The controller 200 communicates with the host according to specific communications standards. The controller 200 communicates with the host through at least one among various communication standards such as universal serial bus (USB), multimedia card (MMC), peripheral component interconnection (PCI), PCI-express, advanced technology attachment (ATA), serial-ATA, parallel-ATA, small computer small interface (SCSI), enhanced small disk interface (ESDI), integrated drive electronics (IDE) and firewire.

The controller 200 and the storage device 100 may be integrated in one semiconductor device. The controller 200 and the storage device 100 may be integrated in one semiconductor device to constitute a solid state drive SSD. The controller 200 and the storage device 100 may be integrated in one semiconductor device to constitute a memory card. For instance, the controller 200 and the storage device 100 may be integrated in one semiconductor device to constitute a memory card such as personal computer memory card international association (PCMCIA), compact flash card (CF), smart media card (SM, SMC), memory stick, multimedia card (MMC, RS-MMC, MMCmicro), SD card (SD, miniSD, microSD, SDHC) and universal flash memory device UFS.

The storage system 1000 may include any of a computer, ultra mobile PC (UMPC), workstation, net-book, personal digital assistants (PDA), portable computer, web tablet, tablet computer, wireless phone, mobile phone, smart phone, e-book, programmable multimedia player (PMP), portable game machine, navigation device, black box, digital camera, digital multimedia broadcasting (DMB) player, 3-dimensional television, smart television, digital audio recorder, digital audio player, digital picture recorder, digital picture player, digital video recorder, digital video player, storage constituting data sensor, device that can transmit/receive information in a wireless environment, one of various electronic devices constituting home network, one of various electronic devices constituting computer network, one of various electronic devices constituting telematics network, RFID device, or one of various constituent elements constituting computing system.

The storage device 100 or the storage system 1000 may be mounted by various types of packages. For example, storage device 100 or the storage system 1000 can be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Figure 2A:
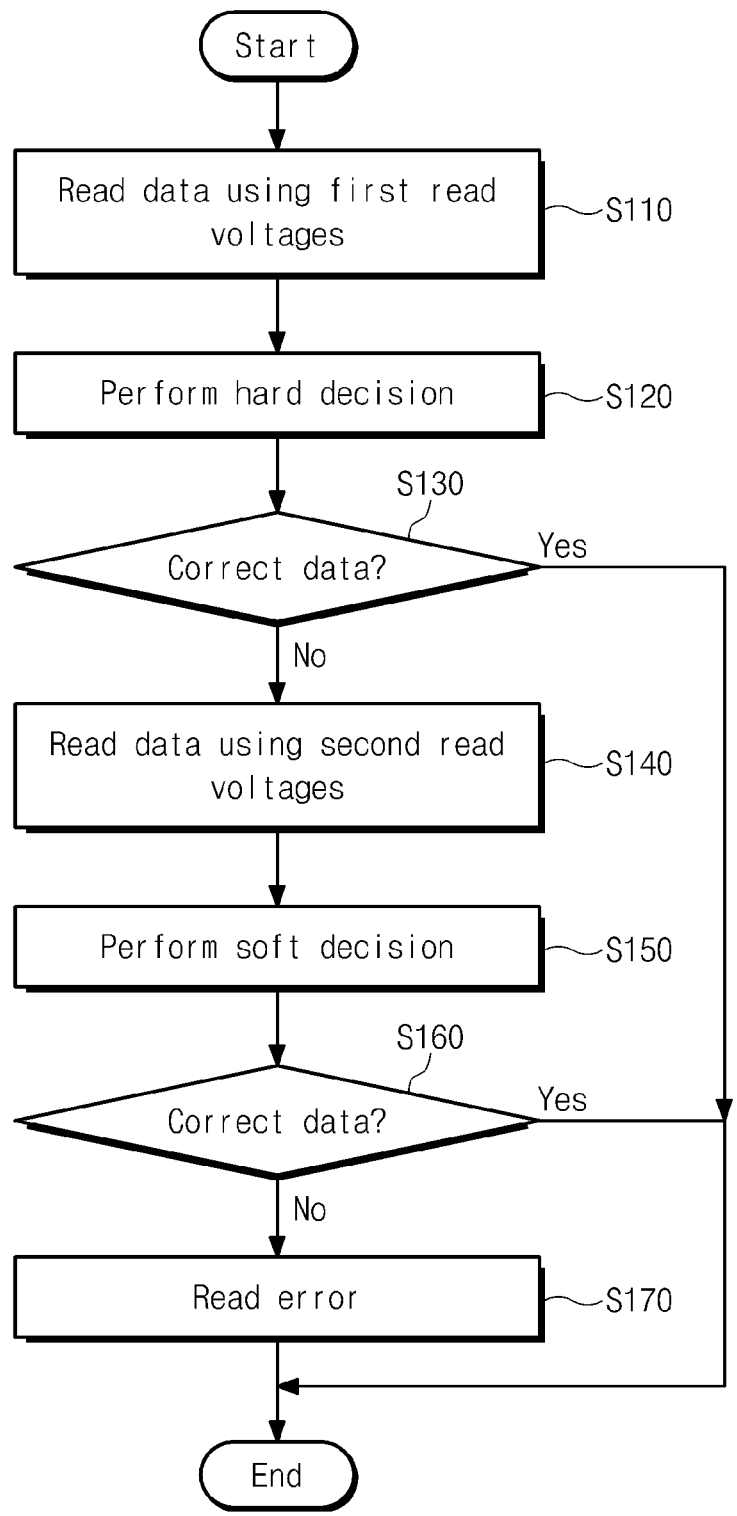
FIG. 2A is flow chart illustrating an error correction decoding method in accordance with at least some example embodiments performed when a read operation is performed.

FIG. 2A is flow chart illustrating an error correction decoding method in accordance with at least some example embodiments performed when a read operation is performed. Referring to FIGS. 1 and 2A, in S110, data is read from the storage device 100 using normal read voltages. The controller 200 generates a read command and an address and transfers the generated read command and address to the storage device 100. The storage device 100 may read data using the normal read voltages in response to the read command and address. The read data may be transferred to the controller 200.

In S120, a hard decision is performed. The error correction code decoder 300 of the controller 200 decodes data (hereinafter it is referred to as first read data) read from the storage device 100 using normal read voltages, that is, decodes data read by the normal read voltages using an error correction code.

In S130, it is distinguished whether or not the hard decided data is correct data, that is, data in which errors are all corrected. The controller 200 distinguishes whether or not the hard decided data is correct data using the hard decided data and parity check matrix. If an arithmetic result of hard decided data and the parity check matrix is '0', it may be distinguished that the hard decided data is correct data. If an arithmetic result of hard decided data and the parity check matrix is not '0', it may be distinguished that the hard decided data is not correct data.

When the hard decided data is correct data, error correction decoding may be over. The hard decided data may be output to the outside or may be used inside the controller 200 as error corrected data.

When the hard decided data is not correct data, S140 is performed. In S140, data is read using fractional read voltages. On memory cells read using normal read voltages, an additional read operation may be performed using the fractional read voltages. The fractional read voltages may have a different level from the normal read voltages.

In S150, a soft decision is performed. The soft decision may be performed on the basis of data (hereinafter it is referred to as second read data) that data read using fractional read voltages is added to the first read data. The normal read voltages and the fractional read voltages may have different levels from each other. Levels of the normal read voltages and the fractional read voltages are illustrated in FIG. 2B.

Figure 2B:
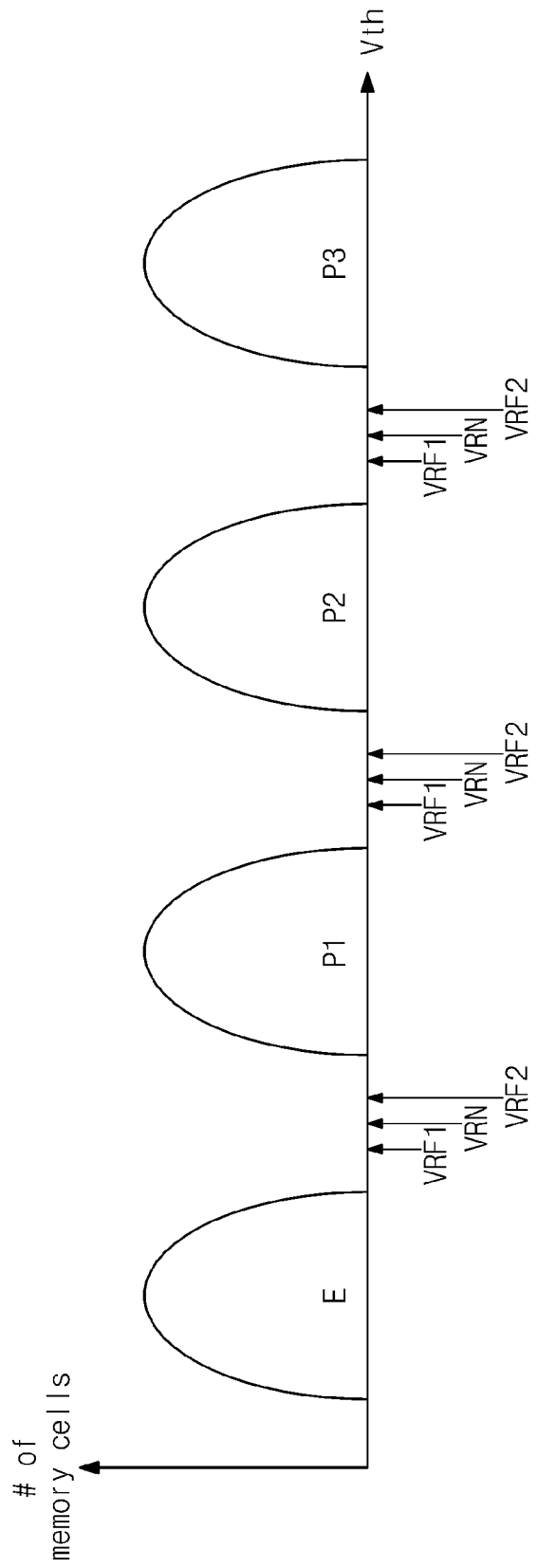
FIG. 2B illustrates an example of normal read voltages and fractional read voltages.

In FIG. 2B an horizontal axis represents a threshold voltage of memory cells and a vertical axis represents the number of memory cells. That is, FIG. 2B represents threshold voltage distributions of memory cells. The memory cells may have an erasure state E and first through third program states P1~P3.

Each normal read voltage VRN may have a level between adjacent two logical states. Each of the fractional read voltage VRF1 and VRF2 may have a level between adjacent two logical states but may have a different level from the normal read voltage.

A result of when memory cells are read by normal read voltages and a result of when memory cells are read by fractional read voltages may be different. For instance, tail cells may exist which have threshold voltages higher or lower than voltage distributions of normal logical state among memory cells. A read result of tail cells of when read by the normal read voltages VRN may be different from a read result of tail cells of when read by the fractional read voltages VFN1 and VFN2. That is, if an additional read operation is performed using the fractional read voltages, additional information (e.g., information on tail cells) on threshold voltages of memory cells may be obtained.

If additional information about threshold voltages of memory cells is obtained, accuracy of probability (or likelihood ratio) that data which memory cell store is a first state (e.g., '1') or a second state (e.g., '0') increases. That is, reliability of decision increases. The controller 200 performs a soft decision using the second read data, that is, data read through several reads and hard decision data obtained by a normal read voltage.

In S160, it is distinguished whether or not the soft decision data is correct data, that is, the soft decision data is data of which errors are all corrected. The controller 200 distinguishes whether or not the soft decision data is correct data using the soft decision data and parity check matrix. If an operation result of the soft decision data and the parity check matrix is '0', it may be distinguished that the soft decision data is correct data. If an operation result of the soft decision data and the parity check matrix is not '0', it may be distinguished that the soft decision data is not correct data. The operation result of the soft decision data and the parity check matrix and the operation result of the hard decision data and the parity check matrix may be performed using the same method.

When the soft decision data is correct data, the error correction decoding may be over. The soft decision data is error corrected data, and it may be output to the outside of the controller 200 or may be used in the inside of the controller 200.

When the soft decision data is not correct data, the controller 200 processes the soft decision data as a read error. The controller 200 processes the read error in the inside thereof or reports the read error to the host. The controller 200 processes the read error according to the predetermined schedule.

As described above, if a read operation is performed in the storage device 100, a hard decision is performed. If the hard decision is failed, at least one read is further performed and a sort decision is performed. The soft decision needs additional reads as compared with the hard decision. Resources (time, stress of storage device 100) consumed when errors are corrected through the soft decision is greater than resources (time, stress of storage device 100) consumed when errors are corrected through the hard decision. Thus, if accuracy of the hard decision increases and thereby the number of times the soft decision is performed is reduced, resources (time, stress of the storage device 100) consumed in the storage device 100 when a read operation is performed may be reduced. According to at least one example embodiment, a hard decision method and a hard decision device having improved accuracy may be provided, and thereby a read method and a storage system consuming less resources (time, stress of the storage device 100) when a read operation is performed may be provided.

Figure 3:
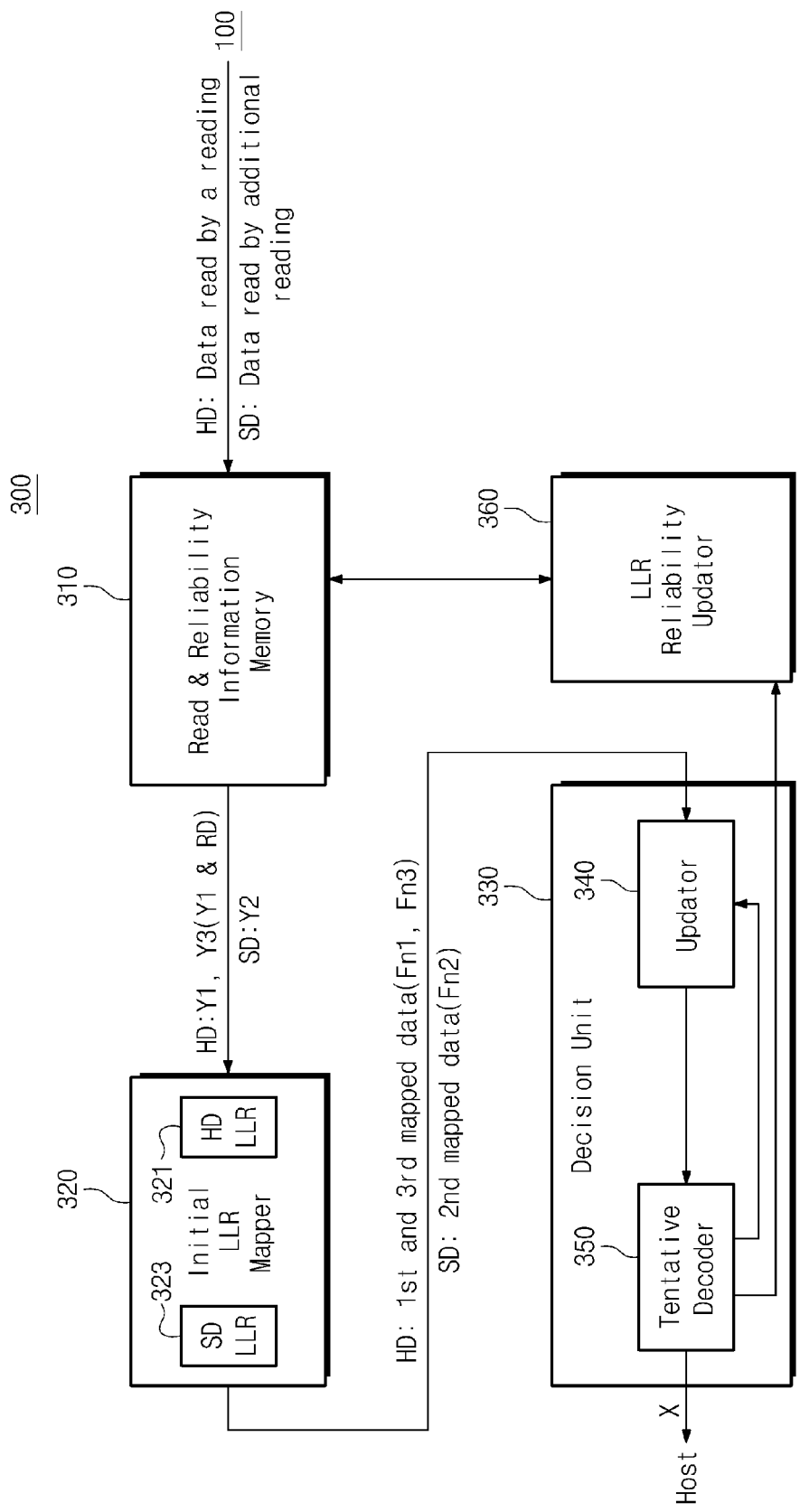
FIG. 3 is a block diagram illustrating an error correction code decoder in accordance with at least some example embodiments.

FIG. 3 is a block diagram illustrating an error correction code decoder 300 in accordance with at least some example embodiments. Referring to FIG. 3, the error correction code decoder 300 includes a read & reliability information memory 310, an initial log-likelihood ratio (LLR) mapper 320, a decision unit 330 and a log-likelihood ratio (LLR) reliability updater 360.

The read & reliability information memory 310 stores read data read from the storage device 100. When a hard decision is performed, the read & reliability information memory 310 receives data read through a normal read from the storage device 100 and stores the data as first read data Y1. The normal read means a reading operation using the normal read voltage of FIG. 2B. Also, when a hard decision is performed, the read & reliability information memory 310 receives data representing reliability of initial log-likelihood ratio (LLR) from the log-likelihood ratio (LLR) reliability updater 360 and stores the data as reliability data RD. The first read data Y1 and the reliability data RD are stored together with each other to form third read data Y3.

When a soft decision is performed, the read & reliability information memory 310 receives data read through an additional read from the storage device 100 and stores the data. That is, when a soft decision is performed, the read & reliability information memory 310 stores the first read data Y1 stored when the hard decision is performed and the additionally stored data as second read data Y2.

The initial log-likelihood ratio (LLR) mapper 320 is configured to map an initial log-likelihood ratio to read data stored in the read & reliability information memory 310. The initial log-likelihood ratio (LLR) mapper 320 includes a hard decision log-likelihood ratio register 321 storing log-likelihood ratio (LLR) to be mapped when a hard decision is performed and a soft decision log-likelihood ratio register 323 storing log-likelihood ratio (LLR) to be mapped when a soft decision is performed.

When a hard decision is performed, the initial log-likelihood ratio (LLR) mapper 320 receives the first read data Y1 from the read & reliability information memory 310. The initial log-likelihood ratio (LLR) mapper 320 maps log-likelihood ratio (LLR) on the basis of the log-likelihood ratio (LLR) stored in the hard decision log-likelihood ratio register 321 and each bit value of the first read data Y1. For example, the initial log-likelihood ratio (LLR) mapper 320 maps log-likelihood ratio (LLR) of corresponding bit according to a bit value read from a specific memory cell among the first read data Y1. The mapped result is output as first mapped data Fn1.

When a hard decision is performed, the initial log-likelihood ratio (LLR) mapper 320 receives the third read data Y3 from the read & reliability information memory 310. When the third read data Y3 is received, the initial log-likelihood ratio (LLR) mapper 320 maps log-likelihood ratio (LLR) with reference to the hard decision log-likelihood ratio register 321. The mapped result is output as third mapped data Fn3.

When a soft decision is performed, the initial log-likelihood ratio (LLR) mapper 320 receives the second read data Y2 from the read & reliability information memory 310. The initial log-likelihood ratio (LLR) mapper 320 maps log-likelihood ratio (LLR) on the basis of the log-likelihood ratio (LLR) stored in the soft decision log-likelihood ratio register 323 and bits of each element of the second read data Y2.

One bit of the first read data Y1 is a single read result performed on one memory cell of the storage device 100. Bits of each element of the second read data Y2 includes a single read result performed in one memory cell and an additional read result. The initial log-likelihood ratio (LLR) mapper 320 maps log-likelihood ratio (LLR) on the basis of the bits of each element of the second read data Y2. The mapped result is output as second mapped data Fn2.

The decision unit 330 receives the first mapped data Fn1 or the third mapped data Fn3 from the initial log-likelihood ratio (LLR) mapper 320 when a hard decision is performed and receives the second mapped data Fn2 from the initial log-likelihood ratio (LLR) mapper 320 when a soft decision is performed. The decision unit 330 decodes the received first, second or third mapped data Fn1, Fn2 or Fn3. Decoding of the first mapped data Fn1, decoding of the second mapped data Fn2 and decoding of the third mapped data Fn3 are performed using the same method and device.

The hard decision log-likelihood ratio register 321 separately stores log-likelihood ratio corresponding to the first read data Y1 and log-likelihood ratio corresponding to the third read data Y3. The hard decision log-likelihood ratio register 321 stores log-likelihood ratio corresponding to the first read data Y1 and the soft decision log-likelihood ratio register 323 stores log-likelihood ratio corresponding to the second read data Y2 and the third read data Y3 in common. That is, the second read data Y2 and the third read data Y3 may be mapped with the same log-likelihood ratio.

The decision unit 330 includes an updater 340 and a tentative decoder 350. The updater 340 performs updating of check nodes and variable nodes. The updating result transfers to the tentative decoder 350.

The tentative decoder 350 performs a tentative decoding according to the updating result (for example, posteriori probability) of the updater 340. The tentative decoder 350 performs an arithmetic operation of decoded data and parity check matrix and distinguishes whether the decoding operation is correctly performed according to the operation result. If the decoding operation is correctly performed, that is, if errors of data read from the storage device 100 are corrected, the tentative decoder 350 outputs the decoded data as final data X. If the decoding operation is not correctly performed, that is, if errors of data read from the storage device 100 are not all corrected, the tentative decoder 350 calls the updater 340. In response to a call of the tentative decoder 350, the updater 340 performs updating of the check nodes and the variable nodes again.

Updating of the updater 340 and a decoding of the tentative decoder 350 are iteratively performed. The updating of check nodes and variable nodes performed in the updater 340 and the decoding performed in the tentative decoder 350 form one decoding loop.

In the decision unit 330, a hard decision HD is performed on the basis of the first mapped data Fn1 and when a parity check is failed, the tentative decoder 350 transmits the decoding result to the log-likelihood ratio (LLR) reliability updater 360.

The log-likelihood ratio (LLR) reliability updater 360 compares the decoding result with the first read data Y1 stored in the read & reliability information memory 310. When a specific bit of the first read data Y1 and a bit of decoding result which is at the same location as the specific bit have the same value, the log-likelihood ratio (LLR) reliability updater 360 stores a reliability bit indicating that reliability of specific bit is high in the read & reliability information memory 310. When a specific bit of the first read data Y1 and a bit of decoding result which is at the same location as the specific bit have different values from each other, the log-likelihood ratio (LLR) reliability updater 360 stores a reliability bit indicating that reliability of specific bit is low in the read & reliability information memory 310 as reliability data RD.

The log-likelihood ratio (LLR) reliability updater 360 generates one reliability bit with respect to each bit of the first read data Y1 when decoding loop is performed once. When decoding loop is performed k number of times, k number of reliability bits corresponding to each bit of the first read data Y1 is generated. The log-likelihood ratio (LLR) reliability updater 360 generates reliability bits during the predetermined number of decoding loops. After the predetermined number of decoding loops is performed, the log-likelihood ratio (LLR) reliability updater 360 stops generation of reliability bit.

When a hard decision is performed, the first read data Y1 is stored in the read & reliability information memory 310. On the basis of the first read data Y1, the initial log-likelihood ratio (LLR) mapper 320 maps log-likelihood ratios (LLR). The first read data Y1 is represented as a mathematical formula 1 below.

$Y1=[0\ 1\ 1\ 0\ 1\ 1\ 1]$ [mathematical formula 1]

The initial log-likelihood ratio (LLR) mapper 320 maps log-likelihood ratios (LLR) having the same size and different signs according to each bit of the first read data Y1. When a bit of the first read data Y1 is '1', the initial log-likelihood ratio (LLR) mapper 320 maps log-likelihood ratios (LLR) of '+M' to corresponding bit. When a bit of the first read data Y1 is '0', the initial log-likelihood ratio (LLR) mapper 320 maps log-likelihood ratios (LLR) of '−M' to corresponding bit. That is, the first mapped data Fn1 that log-likelihood ratios (LLR) of '+M' and '−M' are mapped to the first read data Y1 is represented as a mathematical formula 2 below.

$Fn1=[-M\ +M\ +M\ -M\ +M\ +M\ +M]$ [mathematical formula 2]

The first mapped data Fn1 is transmitted to the decision unit 330. The decision unit 330 performs a hard decision according to the first mapped data Fn1.

When a soft decision is performed, the second read data Y2 is stored in the read & reliability information memory 310. On the basis of the second read data Y2, the initial log-likelihood ratio (LLR) mapper 320 maps log-likelihood ratios (LLR). The second read data Y2 includes bits of the first read data Y1 and additional bits corresponding thereto. The second read data Y2 is represented by a mathematical formula 3 below.

$Y2=[011\ 101\ 111\ 001\ 100\ 110\ 101]$ [mathematical formula 3]

Elements of the second read data Y2 include 3 bits. The first bit of each element is each bit of the first read data Y1. The rest bits of each element are results of additional reads. If each element of the second read data Y2 includes 3 bits, each element has one of 8 patterns of '000' through '111'. The initial log-likelihood ratio (LLR) mapper 320 maps one of 8 log-likelihood ratios (LLR) according to a value of each element of the second read data Y2. The number of bits of each element of the second read data Y2 is not limited.

To perform a soft decision, information about threshold voltages of memory cells is additionally obtained through an additional read. On the basis of the additional information, various log-likelihood ratios (LLR) are mapped. Although one memory cell is read as '1' at the first read, it is read as '1' having a threshold voltage which is nearly '0' through an additional read. That memory cell is mapped to have a low log-likelihood ratio (LLR). One memory cell is read as '1' at the first read and is read as '1' having a threshold voltage which is greatly different from '0'. That memory cell is mapped to have a high log-likelihood ratio (LLR). Since using additional information about threshold voltages of memory cells, decoding accuracy of soft decision SD is higher than decoding accuracy of hard decision HD.

According to at least some example embodiments, decoding is performed using the third read data Y3 formed by the first read data Y1 and reliability bits. Decoding using the third read data Y3 has the nearly same accuracy as compared with decoding using the second read data Y2 with the same overhead of when using the first read data Y1.

Figure 4:
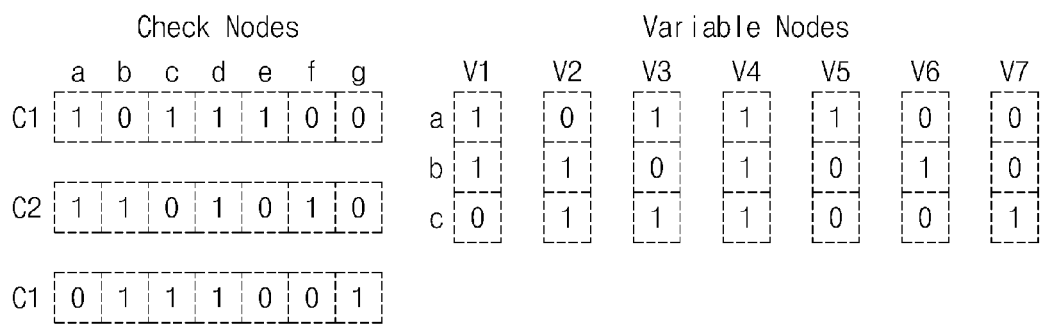
FIG. 4 illustrates an example of parity check matrix used in the error correction code decoder of FIG. 3.

FIG. 4 illustrates an example of parity check matrix H used in the error correction code decoder of FIG. 3. "1011100" is sequentially disposed at the first row of parity check matrix H, "1101010" is sequentially disposed at the second row of parity check matrix H and "0111001" is sequentially disposed at the third row of parity check matrix H.

First elements, second elements and third elements among elements of the parity check matrix H form first, second and third check nodes respectively. First through seventh column elements among factors of the parity check matrix H form first through seventh variable nodes respectively.

For convenience of description, elements of the first, second and third check nodes are represented by reference codes a through g according to a location of column of the parity check matrix H. Also, elements of the first through seventh variable nodes are represented by reference codes a, b and c according to a location of row of the parity check matrix H.

As illustrated in FIG. 4, each element of the parity check matrix H is the check node and also the variable node.

The parity check matrix H used in the error correction code decoder 300 is not limited to the matrix illustrated in FIG. 4. A parity check matrix having '1' of density lower than the parity check matrix H illustrated in FIG. 4 is used in the error correction code decoder 300. A size of parity check matrix used in the error correction code decoder 300 is not limited to 3×7 illustrated in FIG. 4.

Figure 5:
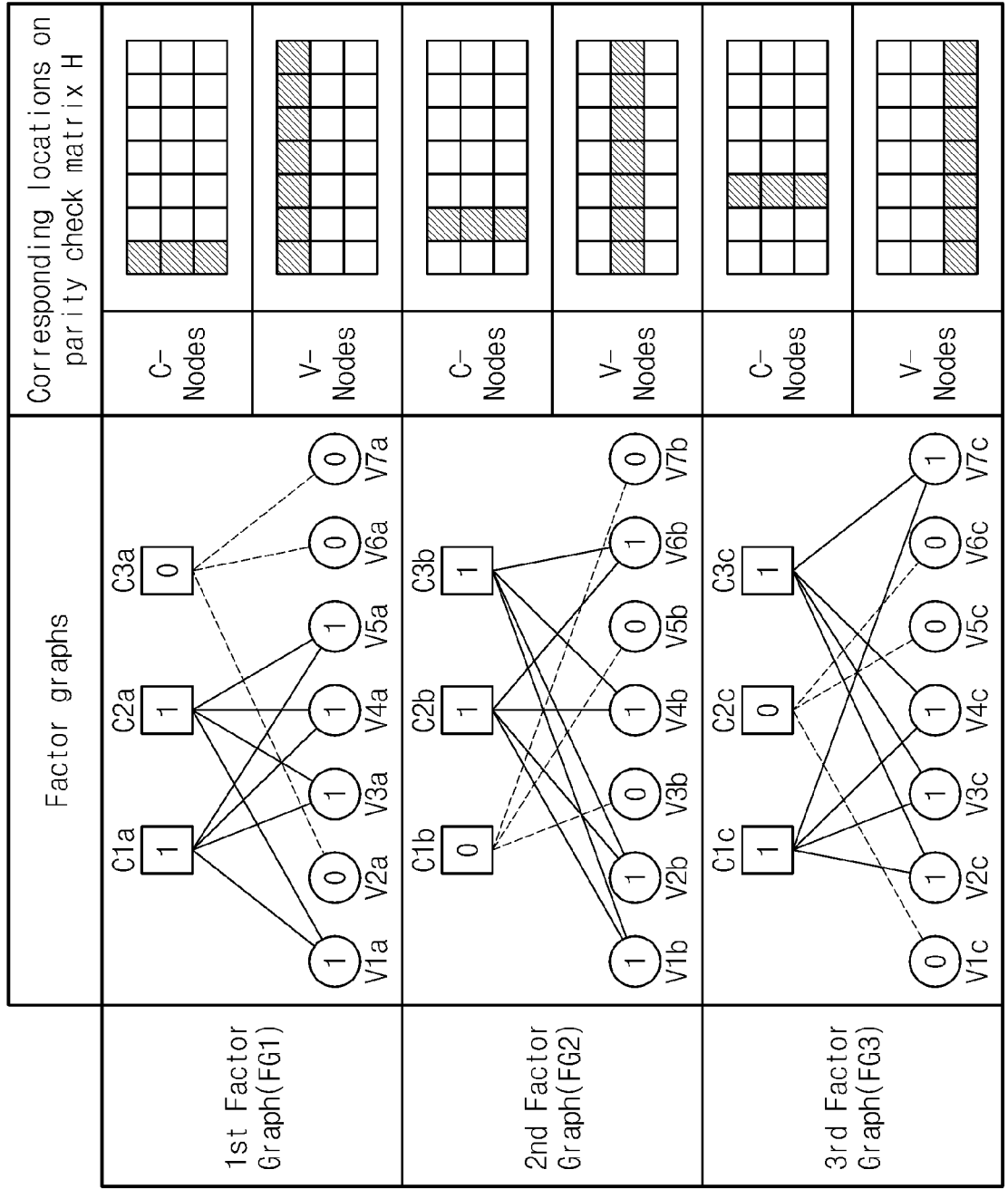
FIG. 5 illustrates factor graphs drawn from the parity check matrix of FIG. 4.

FIG. 5 illustrates factor graphs FG1~FG3 drawn from the parity check matrix of FIG. 4. Referring to FIGS. 4 and 5, the first factor graph FG1 shows a factor graph between first through third check nodes C1a, C2a and C3a and first through seventh variable nodes V1a~V7a.

The check nodes C1a and C2a having '1' may have a connection relation with the variable nodes V1a and V3a~V5a having '1' and message may be transmitted therebetween. For instance, the variable node V1a having '1' may have a connection relation with the check nodes C1a and C2a having '1'. The check node V1a may have a connection relation with the variable nodes V1a and V3a~V5a having '1'.

The check node C3a having '0' may have a connection relation with the variable nodes V2a, V6a and V7a having '0' but message cannot be transmitted therebetween.

The second factor graph FG2 shows a factor graph between first through third check nodes C1b, C2b and C3b and first through seventh variable nodes V1b~V7b. The check nodes C2b and C3b having '1' may have a connection relation with the variable nodes V1b, V2b, V4b and V6b having '1' and message may be transmitted therebetween. The check node C1b having '0' may have a connection relation with the variable nodes V3b, V5b and V6b having '0' but message cannot be transmitted therebetween.

The third factor graph FG3 shows a factor graph between first through third check nodes C1c, C2c and C3c and first through seventh variable nodes V1c~V7c. The check nodes C1c and C3c having '1' may have a connection relation with the variable nodes V2c~V4c and V7c having '1' and message may be transmitted therebetween. The check node C2c having '0' may have a connection relation with the variable nodes V1c, V5c and V6c having '0' but message cannot be transmitted therebetween.

In the first factor graph FG1, a relation between the check nodes C1a, C2a and C3a of 'a' column of the parity check matrix H and the variable nodes V1a~V7a of 'a' row of the parity check matrix H is illustrated. In the same manner, the variable nodes V1a~V7a of 'a' row form factor graphs with the check nodes of 'b' through 'g' columns respectively.

In the second factor graph FG2, a relation between the check nodes C1b, C2b and C3b of 'b' column of the parity check matrix H and the variable nodes V1b~V7b of 'b' row of the parity check matrix H is illustrated. In the same manner, the variable nodes V1b~V7b of 'b' row form factor graphs with the check nodes of 'a' and 'c' through 'g' columns respectively.

In the third factor graph FG3, a relation between the check nodes C1c, C2c and C3c of 'c' column of the parity check matrix H and the variable nodes V1c~V7c of 'c' row of the parity check matrix H is illustrated. In the same manner, the variable nodes V1c~V7c of 'c' row form factor graphs with the check nodes of 'a', 'b' and 'd' through 'g' columns respectively.

In FIGS. 4 and 5, the parity check matrix H and the check nodes, variable nodes and the factor graphs based on the parity check matrix H were described. The error correction code decoder 300 performs decoding on the basis of message transmission between the check nodes and the variable nodes.

Figure 6:
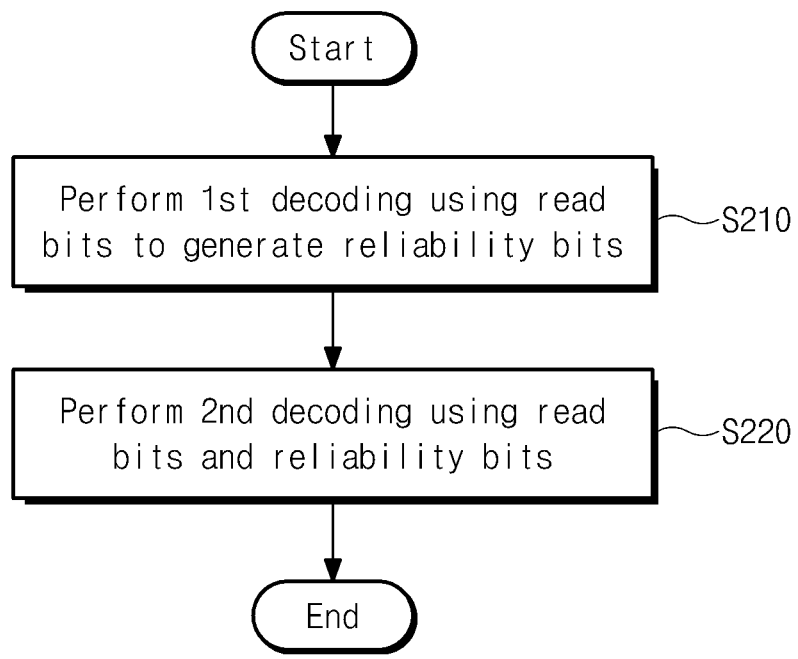
FIG. 6 is a flow chart illustrating an error correction method of error correction code decoder when performing a read operation.

FIG. 6 is a flow chart illustrating an error correction method of error correction code decoder 300 when performing a read operation. A hard decision method corresponding to the S120 of FIG. 2A is illustrated in FIG. 6. Referring to FIGS. 3 and 6, in S210, a first decoding is performed using read bits of the first read data Y1 to generate reliability bits corresponding to the read bits of the first read data Y1 respectively. Two or more reliability bits are generated with respect to one read bit of the first read data Y1. The first decoding is a low density parity check decoding LDPC. The first decoding is a decoding of hard decision HD performed on the basis of read result using a normal read voltage. The reliability bits form reliability data RD. The first read data Y1 and the reliability data RD form third read data Y3.

In S220, a second decoding is performed using the first read data Y1 and the reliability data RD, that is, the third read data Y3. The second decoding is a low density parity check decoding LDPC. The second decoding is a decoding of hard decision HD performed on the basis of read result using a normal read voltage.

Figure 7:
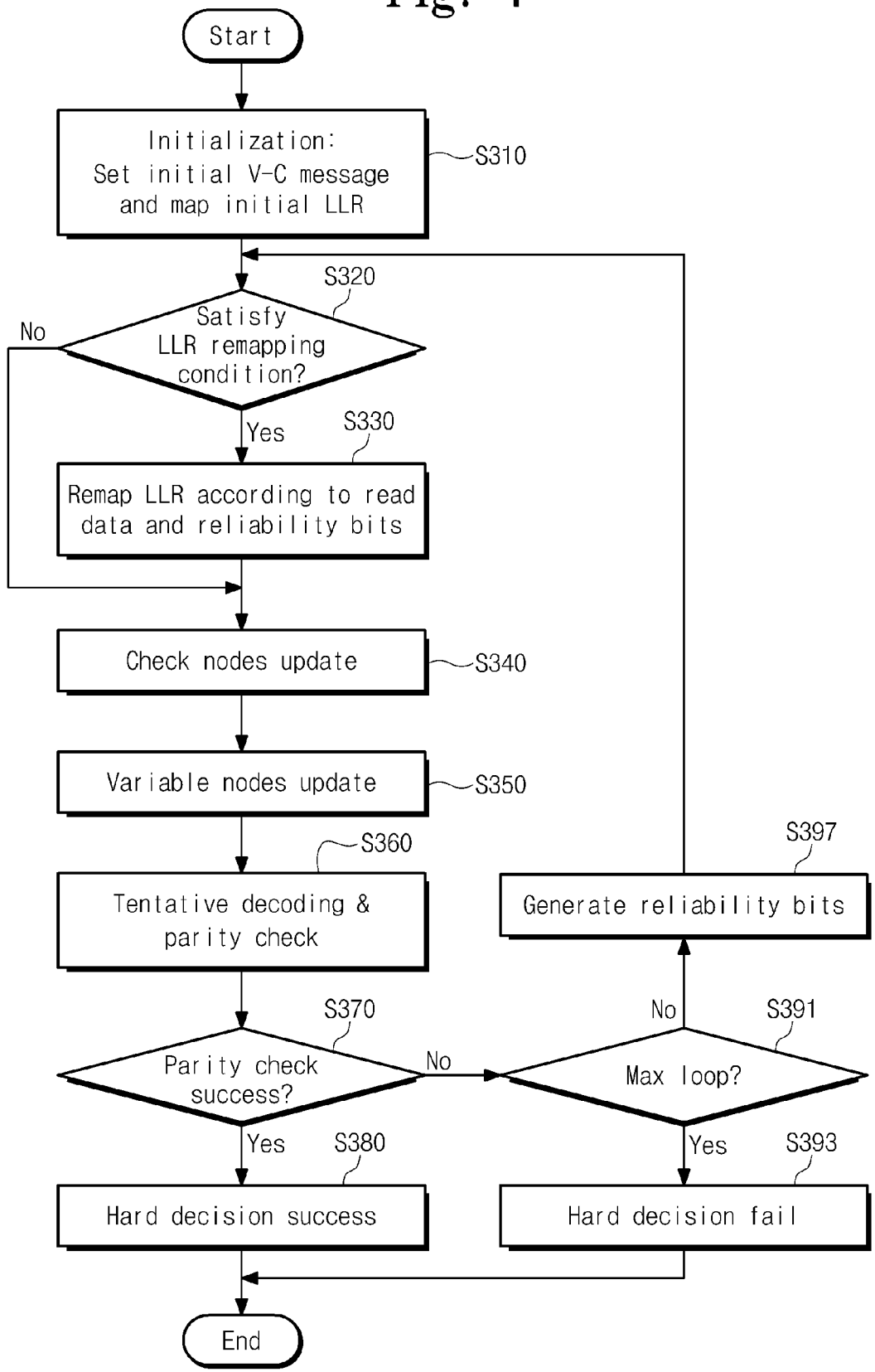
FIG. 7 is a flow chart illustrating a method of performing a decoding in more detail.

FIG. 7 is a flow chart illustrating a method of performing a decoding in more detail. Referring to FIGS. 3 and 7, in S310, initialization is performed. An initial V-C message is set which is transmitted from the variable nodes to the check nodes. An initial log-likelihood ratio (LLR) may be mapped to the first read data Y1 to generate the first mapped data Fn1.

In S320, it is distinguished whether a LLR remapping condition is satisfied or not. The LLR remapping condition may include whether or not the number of reliability bits corresponding to one bit of the first read data Y1 reaches the predetermined value. That is, if the number of reliability bits reaches the previously set value, in S330, the log-likelihood ratio (LLR) may be remapped to the first read data Y1 and the reliability data RD to generate the third mapped data Fn3.

The LLR remapping condition may include whether or not the number of times decoding is performed reaches the previously set value after the number of reliability bits reaches the previously set value. If the number of reliability bits reaches the previously set value and the number of decoding being performed after that reaches the previously set value, in the S330, the log-likelihood ratio (LLR) may be remapped to the first read data Y1 and the reliability data RD to generate the third mapped data Fn3.

In S340, the check nodes are updated on the basis of the V-C message. An updated result is a C-V message which will be transmitted from the check nodes to the variable nodes.

In S350, the variable nodes are updated on the basis of the C-V message. An updated result is a V-C message which will be transmitted from the variable nodes to the check nodes.

In S360, a tentative decoding and parity check are performed. The tentative decoding is performed according to an updated result of variable nodes of the S350. The parity check is performed using the decoded data and the parity check matrix H.

In S370, it is distinguished whether the parity check succeeds. If the parity check succeeds, it is judged that a hard decision succeeds in S380, and then the error correction decoding is over.

If the parity check is failed, it is distinguished whether the number of decoding loops reaches the maximum or reference value in S391. If the number of decoding loops reaches the maximum or reference value, in S393, it may be judged that a hard decision is failed. If the number of decoding loops does not reach the maximum value, in S397, reliability bits are generated. One reliability bit is generated with respect to one bit of the first read data Y1. After that, the S320 is performed again.

The maximum or reference value of reliability bits is 1 or greater than 1. If generation of reliability bits is completed, reliability bits of the number corresponding to the maximum or reference or reference value are generated with respect to each bit of the first read data Y1.

When the number of reliability bits is the maximum or reference value and new reliability bits are generated in S397, the oldest value among the reliability bits stored before may be deleted. That is, if the number of reliability bits reaches the maximum or reference value, the reliability bits may be managed in the form of FIFO (First-In First-Out).

The initialization of the S310 is performed on the basis of mathematical formula 4.

$$Zmn = Fn1 \quad \text{[mathematical formula 4]}$$

Herein, the Zmn indicates message being transmitted from mth variable node among n number of variable nodes. Z21 indicates message being transmitted from second variable node V1$b$ among the first variable nodes V1$a$, V1$b$ and V1$c$.

A message which n variable node transmits is log-likelihood ratio (LLR) of nth element. If the initialization is performed, an initial V-C message is generated which is transmitted from variable nodes to check nodes. When a soft decision SD is performed, the initial V-C message is the second mapped data Fn2.

Figure 8:
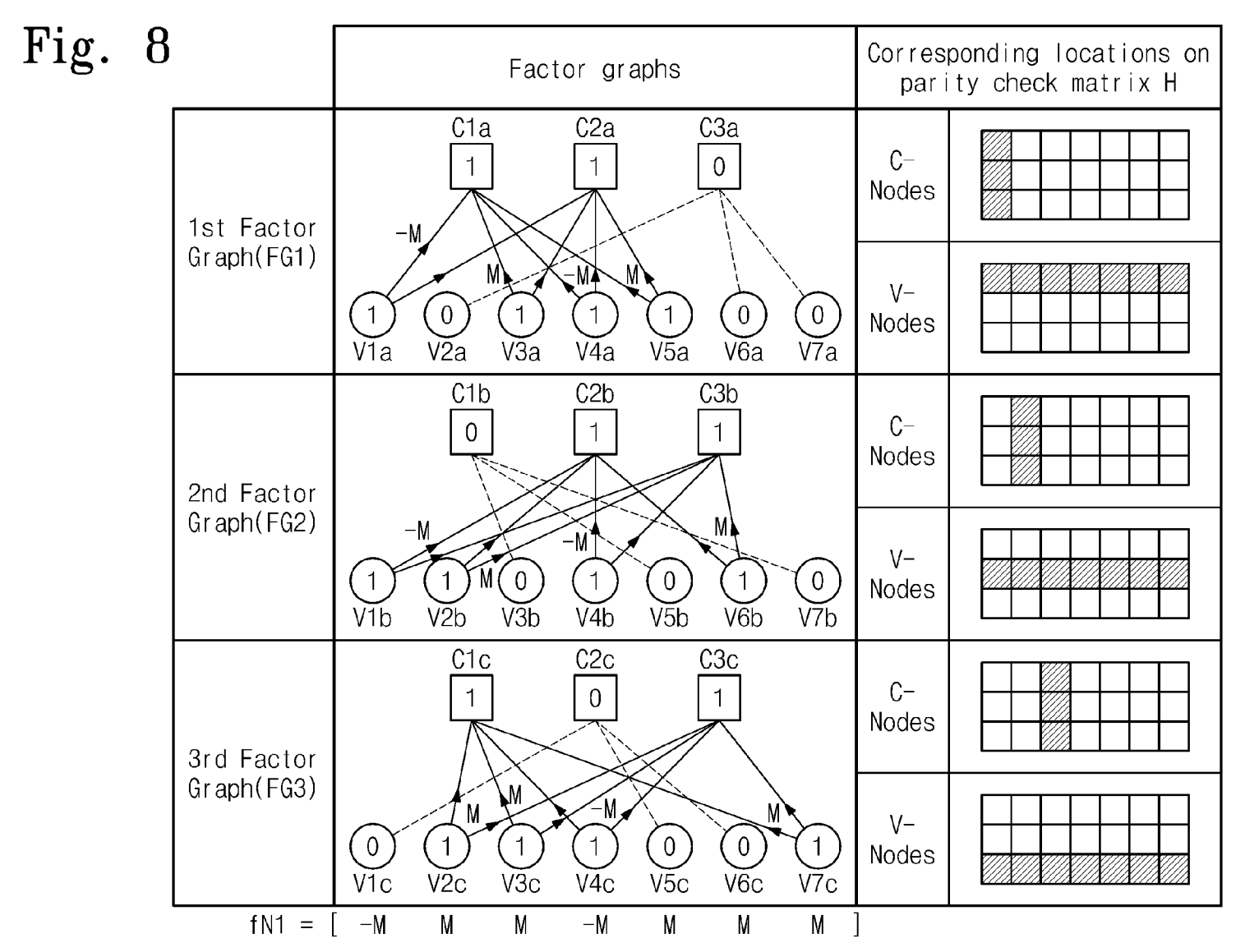

FIG. 8 illustrates factor graphs for describing an initialization step S310 of FIG. 7. Referring to FIG. 8, a first variable node V1$a$ of first factor graph FG1 transmits a message to first and second check nodes C1$a$ and C2$a$. According to the mathematical formula 4, the variable node V1$a$ transmits a log-likelihood ratio (LLR) of '−M' which is a first element of the first mapped data Fn1 as the initial message.

A second variable node V2$a$ does not transmit a message to the check nodes C1$a$~C3$a$.

A third variable node V3$a$ transmits a message to the first and second check nodes C1$a$ and C2$a$. According to the mathematical formula 4, the third variable node V3$a$ transmits a log-likelihood ratio (LLR) of 'M' which is a third element of the first mapped data Fn1 as the initial message.

In the same manner, a fourth variable node V4$a$ transmits a log-likelihood ratio (LLR) of 'M' which is a fourth element of the first mapped data Fn1 to the first and second check nodes C1$a$ and C2$a$ as the initial message. A fifth variable node V5$a$ transmits a log-likelihood ratio (LLR) of 'M' which is a fifth element of the first mapped data Fn1 to the first and second check nodes C1$a$ and C2$a$ as the initial message. Sixth and seventh variable nodes V6$a$ and V7$a$ do not transmit a message.

In a second factor graph FG2, a first variable node V1$b$ transmits a message to second and third check nodes C2$b$ and C3$b$. According to the mathematical formula 4, the first variable node V1$b$ transmits a log-likelihood ratio (LLR) of '−M' which is a first element of the first mapped data Fn1 as the initial message. In the same manner, a second variable node V2$b$ transmits a log-likelihood ratio (LLR) of 'M' which is a second element of the first mapped data Fn1 to the second and third check nodes C2$b$ and C3$b$ as the initial message. A fourth variable node V4$b$ transmits a log-likelihood ratio (LLR) of '−M' which is a fourth element of the first mapped data Fn1 to the second and third check nodes C2$b$ and C3$b$ as the initial message. A sixth variable node V6$b$ transmits a log-likelihood ratio (LLR) of 'M' which is a sixth element of the first mapped data Fn1 to the second and third check nodes C2$b$ and C3$b$ as the initial message.

In a third factor graph FG3, a second variable node V2$c$ transmits a log-likelihood ratio (LLR) of 'M' which is a second element of the first mapped data Fn1 to first and third check nodes C1$c$ and C3$c$ as the initial message. A third variable node V3$c$ transmits a log-likelihood ratio (LLR) of 'M' which is a third element of the first mapped data Fn1 to the first and third check nodes C1$c$ and C3$c$ as the initial message. A fourth variable node V4$c$ transmits a log-likelihood ratio (LLR) of '−M' which is a fourth element of the first mapped data Fn1 to the first and third check nodes C1$c$ and C3$c$ as the initial message. A seventh variable node V7$c$ transmits a log-likelihood ratio (LLR) of 'M' which is a seventh element of the first mapped data Fn1 to the first and third check nodes C1$c$ and C3$c$ as the initial message.

The variable nodes transmit a log-likelihood ratio (LLR) of the first mapped data Fn1 to the check nodes as the initial message. Each of the variable nodes transmits its value as a message. That is, when an initialization is performed, the variable nodes are updated to log-likelihood ratios (LLR) of the first mapped data Fn1.

Figure 9:
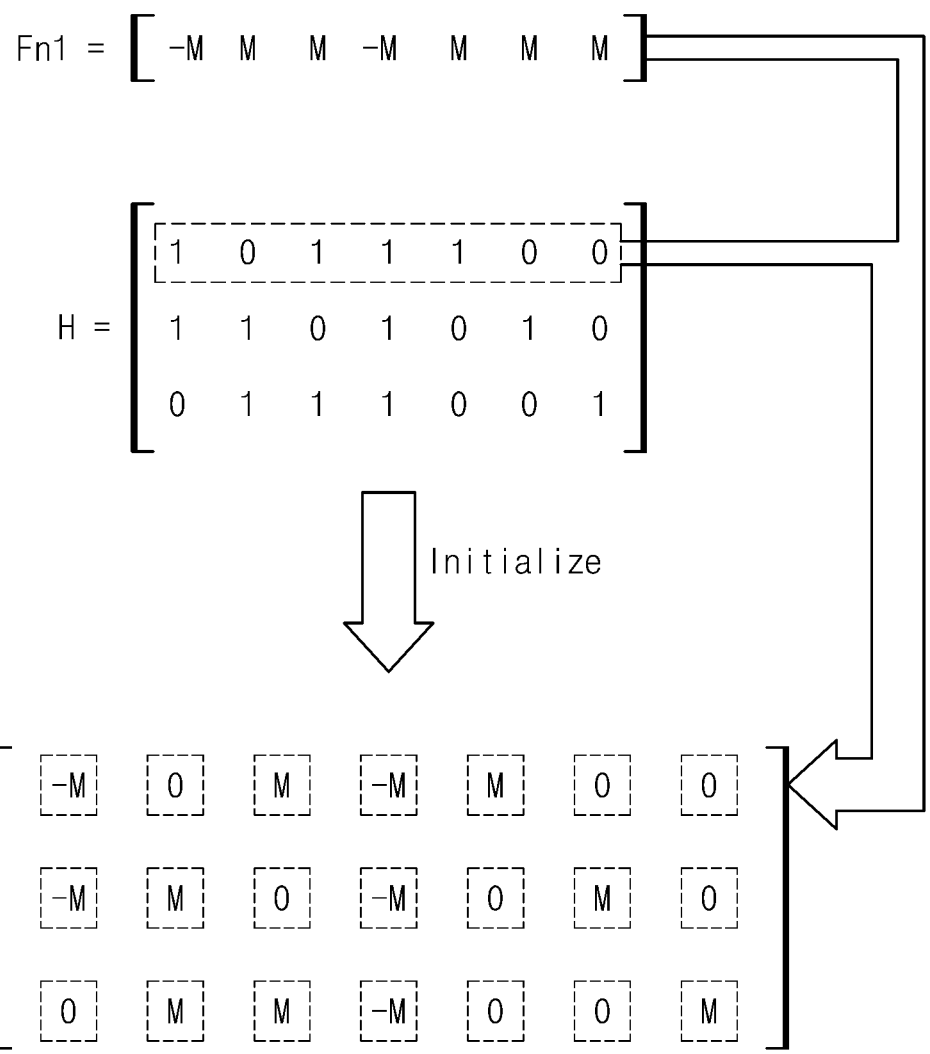
FIG. 9 illustrates an arithmetic operation space of when an initialization is performed.

As illustrated in FIG. 9, nodes having a value of '1' among the variable nodes V1$a$~V7$a$ of first row of the parity check matrix H are updated to log-likelihood ratios (LLR) on the same location of the first mapped data Fn1. Nodes having a value of '1' among the variable nodes V1$b$~V7$b$ of second row of the parity check matrix H are updated to log-likelihood ratios (LLR) on the same location of the first mapped data Fn1. Nodes having a value of '1' among the variable nodes V1$c$~V7$c$ of third row of the parity check matrix H are updated to log-likelihood ratios (LLR) on the same location of the first mapped data Fn1.

Figure 10:
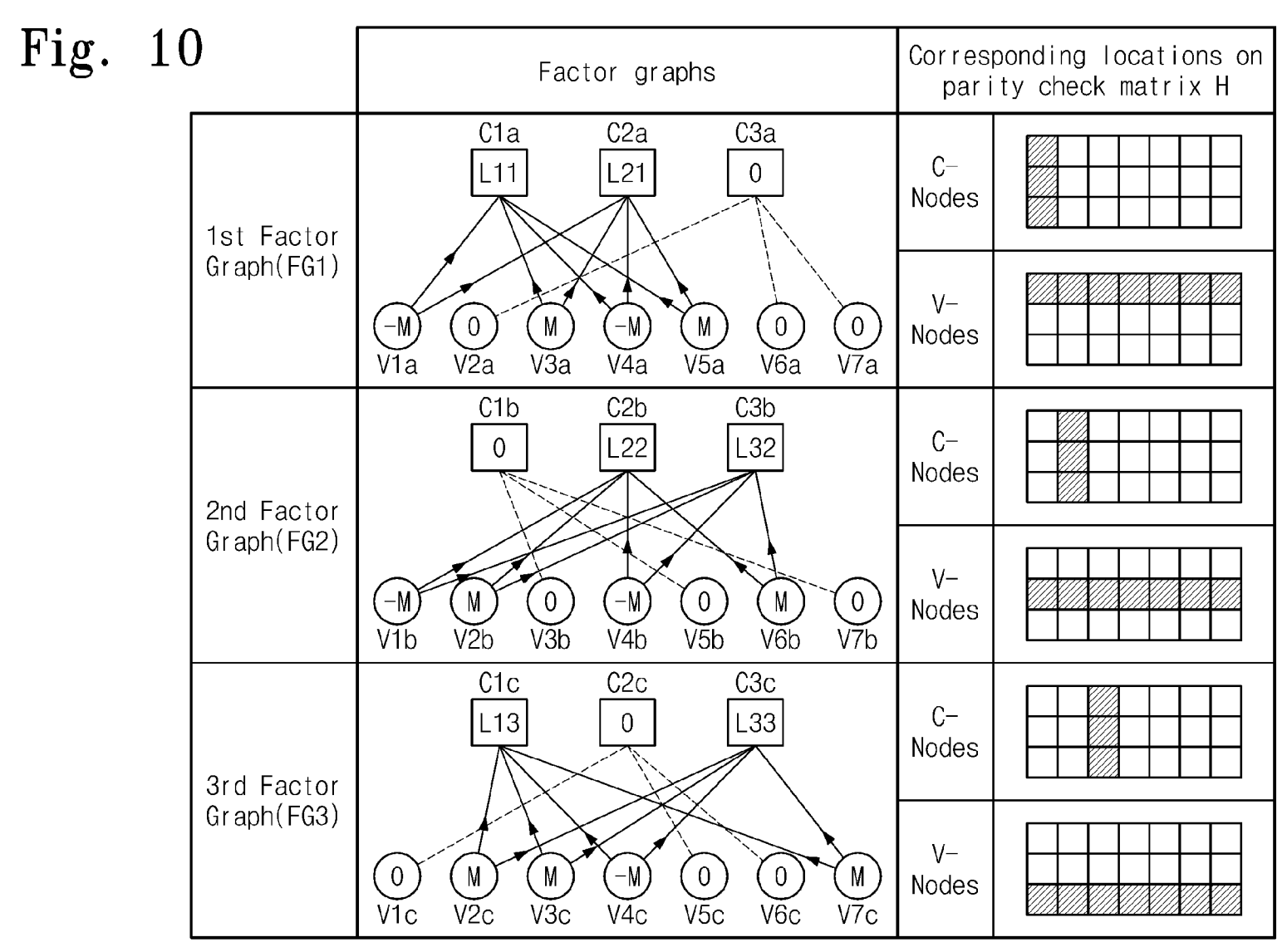

After the initialization (S310 of FIG. 7) is performed, updating (S330 of FIG. 7) of the check nodes is performed. A process of updating of the check nodes is illustrated in FIG. 10. Updating of the check nodes of when a LLR remapping condition is not satisfied is illustrated in FIG. 10.

Referring to FIG. 10, the check nodes receive a V-C message from the variable nodes and are updated according to the received message. Updated values of the check nodes are C-V messages transmitted from the check nodes. That is, updating of the check nodes includes updating of values of the check nodes and a generation of C-V messages. The updating of the check nodes is performed according to a mathematical formula 5.

$$Tmn = \prod_{n' \in N(m) \backslash n} \frac{1 - \text{EXP}(Zmn')}{1 + \exp(Zmn')} \quad \text{[mathematical formula 5]}$$

$$Lmn = \ln \frac{1 - Tmn}{1 + Tmn}$$

C-V message (Lmn) transmitted from nth check node among m number of check nodes is defined by a mathematical formula based on a parameter Tmn. The parameter Tmn is defined by a mathematical formula based on V-C message (Zmn).

Each of the check nodes transmits its value as a C-V message. That is, values of the check nodes are updated to the C-V message. The updated check node transmits its value to the variable node as the C-V message.

When m is selected, that is, the check node C1, C2 or C3 to be updated is selected, a function N(m) indicates nodes inside the selected check node C1, C2 or C3, that is, the variable nodes.

A formula 'N(m)\n' indicates nodes except nth node among the variable nodes corresponding to the selected check node C1, C2 or C3. When second check node C2$b$ among 2 check nodes C2$a$ C2$g$ is calculated, a value of 'n' is 2. At this time, the formula 'N(m)\n' indicates the rest variable nodes except the second variable node C2$b$ among variable nodes V1$b$~V7$b$ of 'b' row corresponding to the selected check node C2. A message Tmn of the check node Cmn is calculated according to values of the variable nodes except nth variable node among the variable nodes corresponding to the m check node Cm.

If a check node to be updated is selected, that is, a variable m is selected, a message (or value) of the check node is updated according to values of the rest variable nodes except variable node on the same location with check nodes to be updated among variable nodes (e.g., variable nodes of row including the selected check node) corresponding to the selected check node.

The mathematical formula 5 includes complicated exponential operations. A hardware or a software performing an arithmetic operation according to the mathematical formula 5 has an overhead such as an arithmetic operation time and power consumption.

To remove complicated exponential operations, an approximation mathematical formula 6 is used.

$$\prod_i Pi \cong \max Pi \qquad \text{[mathematical formula 6]}$$

Using the mathematical formula 6, a mathematical formula 7 which removed complicated exponential operations of the mathematical formula 5 is used to update check nodes.

$$Lmn = (-1)^{\sigma_n \oplus \sigma_{mn}} \cdot \left[\alpha \cdot \min_{m' \in M(n) \setminus n} |Zmn|\right] \qquad \text{[mathematical formula 7]}$$

$$\sigma_{mn} = 1, \text{ if } Zmn > 0$$

$$\sigma_{mn} = 0, \text{ otherwise}$$

$$\sigma_n = \sum_{m \in M(n)} \sigma_{mn} \mod 2$$

Herein, α is a normalized factor. The normalized factor α is used to reduce errors caused by using the approximation mathematical formula 6.

A magnitude of message Lmn of nth check node Cmn among m number of check nodes Cma~Cmg is a value obtained by multiplying the minimum value of the rest check nodes except variable node Vmn on the same location with the check node Cmn among variable nodes Vm1~Vm7 of the same row with the check node Cmn by the normalized factor α.

A sign of message Lmn of the nth check node Cmn among m number of check nodes Cma~Cmg is determined by first and second parameters (σmn, σn). When V-C message (Zmn) received to check node has a positive value, the first parameter σmn has a value of 1. When V-C message (Zmn) received to check node does not have a positive value, the first parameter σmn has a value of 0.

The second parameter σn has a value determined according to the first parameter σmn. A value of the second parameter σn is a result obtained by performing a modulo-2 operation on the total of first parameters σmn being operated according to V-C messages received to check node. That is, a value of the second parameter σn is a result obtained by performing a modulo-2 operation on the number of messages having a positive value among V-C messages received to check node.

When the number of messages having a positive value among V-C messages received to check node is odd number, the second parameter σn has a value of 1. When the number of messages having a positive value among V-C messages received to check node is even number, the second parameter σn has a value of 0. That is, when the number of messages having a positive value among V-C messages received to check node is odd number, a sign of message Lmn of nth check node Cmn among m number of check nodes Cma~Cmg is set to be negative. When the number of messages having a positive value among V-C messages received to check node is even number, a sign of message Lmn of nth check node Cmn among m number of check nodes Cma~Cmg is set to be positive.

If comparing the mathematical formulas 5 and 7, an arithmetic operation of the mathematical formula 7 is simpler than an arithmetic operation of the mathematical formula 5.

For convenience of description, a space is called an operation space OS, which takes the form of matrix such as parity check matrix H, is initialized by the first mapped data Fn1, and then intuitively shows updating of check nodes and updating of variable nodes. Updating of check nodes and updating of variable nodes are described using the operation space OS below.

Figure 11:
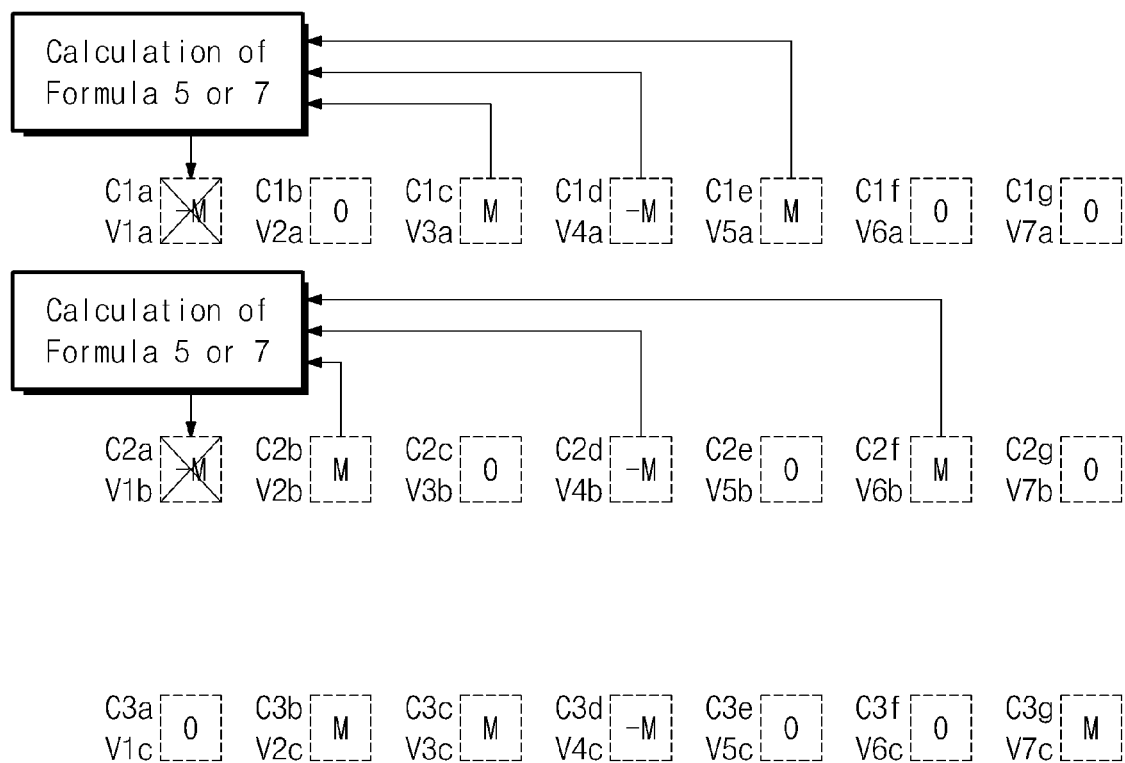
FIGS. 11 and 12 illustrate an arithmetic operation space in accordance with updating method of check nodes.
Figure 12:
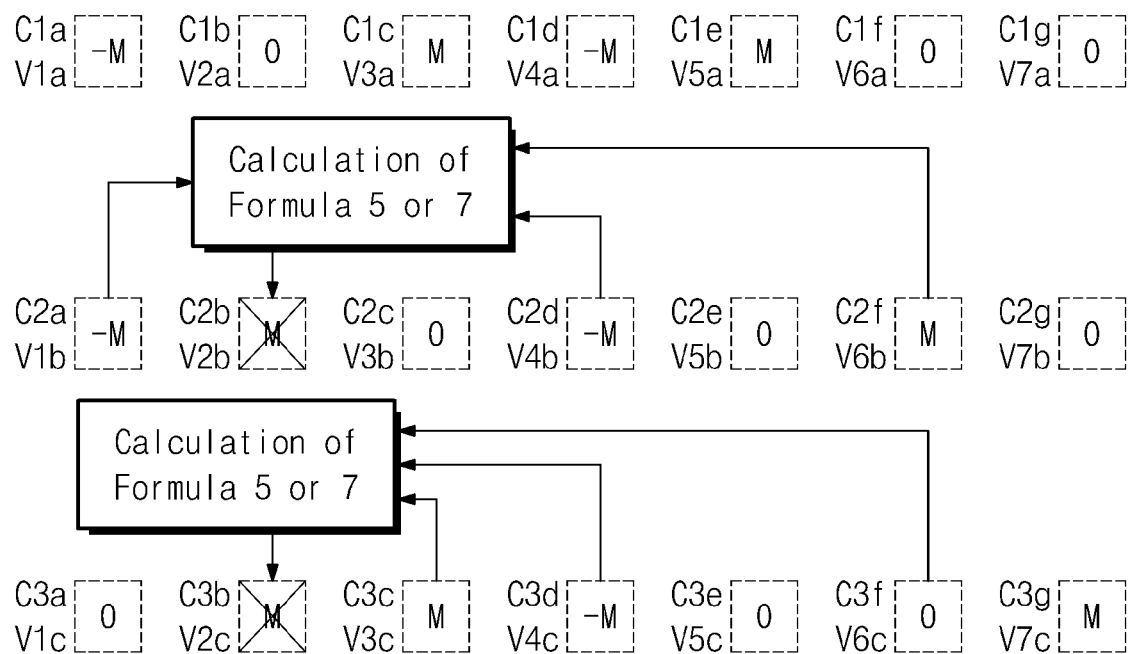

FIGS. 11 and 12 illustrate an arithmetic operation space OS in accordance with updating method of check nodes.

FIG. 11 illustrates updating method of check nodes C1a, C2a and C3a of first column. As stated in the mathematical formula 5 or the mathematical formula 7, if a check node to be updated is selected, that is, if variable m is selected, a message (or value) of the check node is updated according to values of the rest variable nodes except variable node on the same location with check node to be updated among variable nodes in the selected check node.

Among variable nodes V1a~V7a corresponding to first check node C1, variable nodes having a value of 0 cannot transmit a message. Thus, updating of the check node C1a is performed according to a message from variable nodes V3a, V4a and V5a transmitting the message. Updating of the check node C1a is performed according to the mathematical formula 5 or the mathematical formula 7. An operation result of the mathematical formula 5 or the mathematical formula 7 is updated to a new value (or message) of the check node C1a.

In the same manner, the check node C2a is updated according to messages transmitted from variable nodes V2b, V4b and V6b.

Since the check node C3a has a value of 0, it cannot receive a message. Thus, the check node C3a is not updated.

FIG. 12 illustrates updating method of check nodes C1b, C2b and C3b of second column. As stated in the mathematical formula 5 or the mathematical formula 7, if a check node to be updated is selected, that is, if variable m is selected, a message (or value) of the check node is updated according to values of the rest variable nodes except variable node on the same location with check node to be updated among variable nodes Vm1~Vm7 in the selected check node.

Among variable nodes V1b~V7b corresponding to second check node C2, variable nodes having a value of 0 cannot transmit a message. Thus, updating of the check node C2b is performed according to a message from variable nodes V1b, V4b and V6b transmitting the message. Updating of the check node C2b is performed according to the mathematical formula 5 or the mathematical formula 7. An operation result of the mathematical formula 5 or the mathematical formula 7 is updated to a new value (or message) of the check node C2b.

In the same manner, the check node C3b is updated according to messages transmitted from variable nodes V3c, V4c and V7c.

Since the check node C1b has a value of 0, it cannot receive a message. Thus, the check node C1b is not updated.

In the same manner, updating of check nodes of third through seventh columns is performed.

As described with reference to FIGS. 11 and 12, when a specific check node is updated, an arithmetic operation of the mathematical formula 5 or the mathematical formula 7 is performed according to messages of the rest variable nodes except variable nodes on the same location with the specific check node among variable nodes of the same row with the specific check node. An operation result is updated to a value (or message) of the specific check node.

Figure 13:
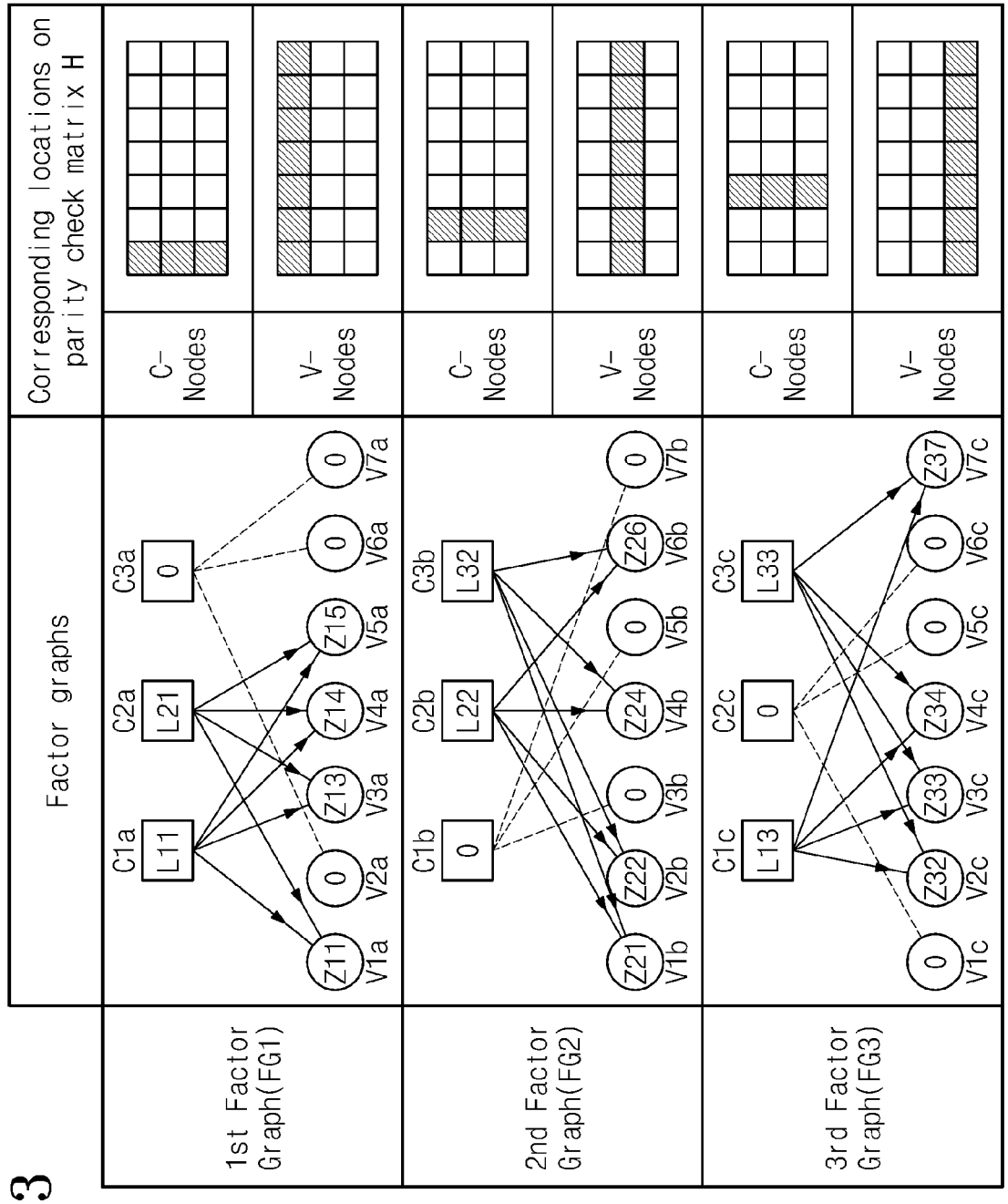
FIG. 13 illustrates a process in which variable nodes are updated.

After updating of check nodes (S340 of FIG. 7) is performed, updating (S350 of FIG. 7) of variable nodes is performed. A process of updating of the variable nodes is illustrated in FIG. 13. Updating of variable nodes of when a LLR remapping condition is not satisfied is illustrated in FIG. 13.

Referring to FIG. 13, the variable nodes receive C-V message from the check nodes and are updated according to the received message. Updated values of the variable nodes are V-C messages transmitted from the variable nodes. That is, the updating of the variable nodes includes updating of values of the variable nodes and a generation of the V-C messages. The updating of the variable nodes is performed according to a mathematical formula 8.

$$Zmn = Zn - Lmn \quad \text{[mathematical formula 8]}$$

Parameter Zn indicates posteriori probability. The posteriori probability Zn indicates probability that read data (e.g., the first read data Y1) of corresponding location is 1 or 0. The posteriori probability Zn is the sum of all the C-V messages received to a specific variable node and the first mapped data Fn1 corresponding to the specific variable node.

A V-C message Zmn transmitted from the specific variable node is a difference the posteriori probability Zn and C-V message Lmn transmitted from check node on the same location with the specific variable node.

Figure 14:
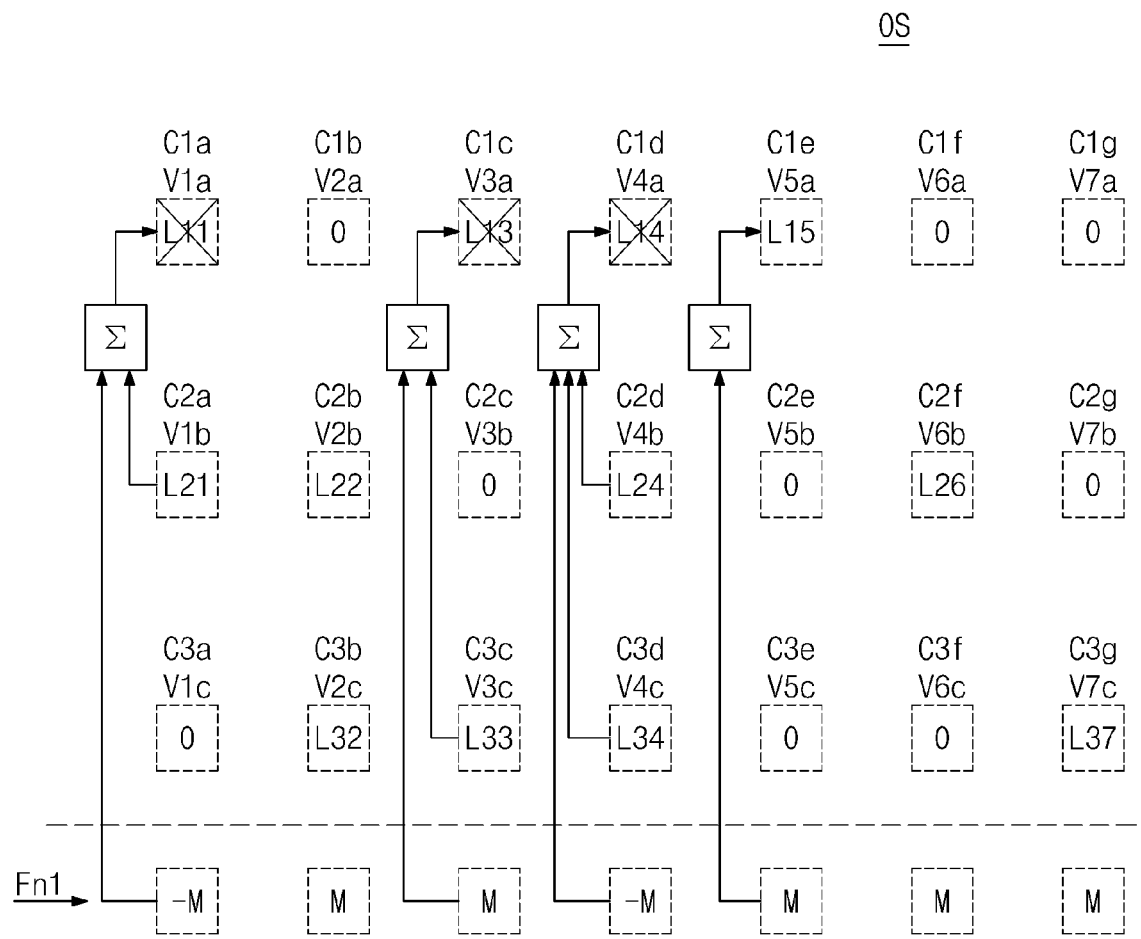
FIGS. 14 and 15 illustrate an arithmetic operation space in accordance with an updating method of variable nodes.
Figure 15:
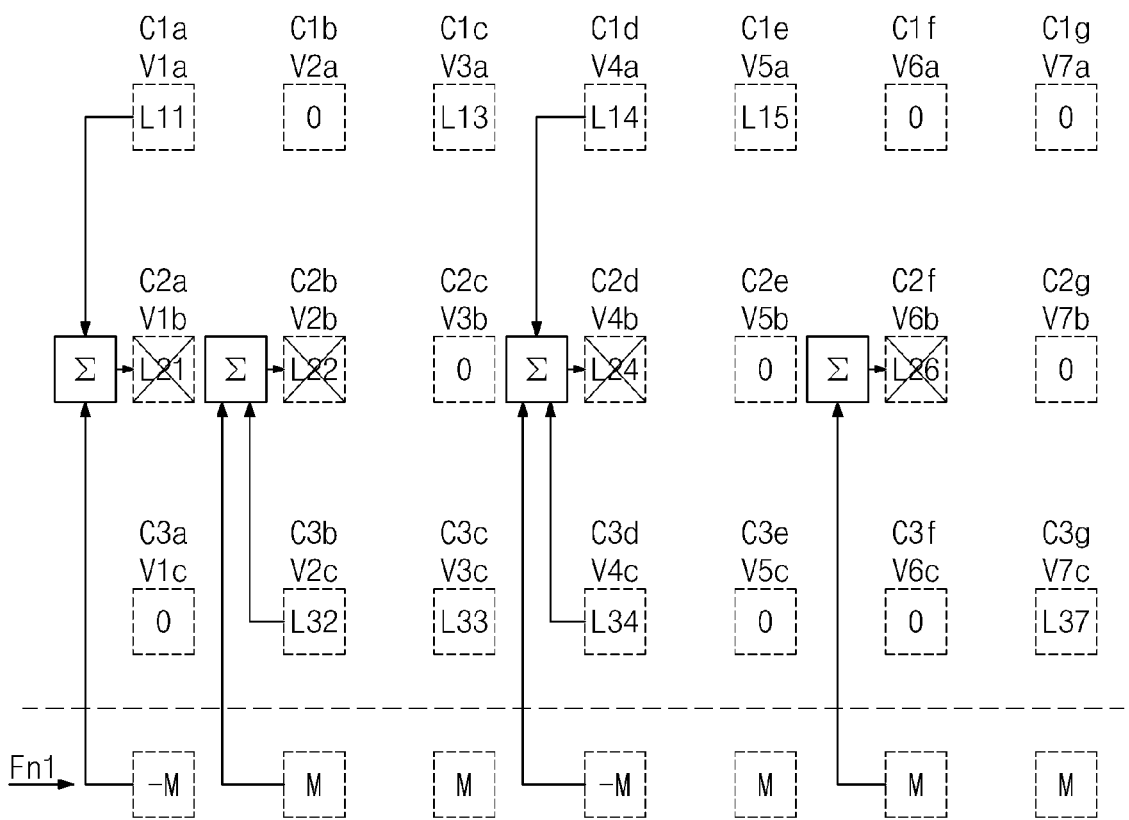

FIGS. 14 and 15 illustrate an arithmetic operation space OS in accordance with updating method of variable nodes. As stated in the mathematical formula 8, if a check node to be updated is selected, that is, if variable n is selected, a message (or value) of the variable node is updated according to values of the rest check nodes except check node on the same location with variable node to be updated among check nodes C1n~C3n in the selected variable node and according to a value of corresponding location among the first mapped data Fn1.

In FIG. 14, updating method of variable nodes V1a~V7a of first row is illustrated. Check node having a value of 0 among check nodes C1a~C3a corresponding to the first variable node V1a cannot transmit a message. Thus, updating of the first variable node V1a is performed according to the check node C2a transmitting a message and a value of –M of the first mapped data Fn1. Updating of the first variable node V1a is performed according to the mathematical formula 8. An operation result of the mathematical formula 8 is updated to a new value (or message) of the first variable node V1a.

In the same manner, the variable node V3a is updated according to a message transmitted from the check node C3c and a value M of the first mapped data Fn1. The variable node V4a is updated according to messages transmitted from the check nodes C2d and C3d and a value –M of the first mapped data Fn1. The variable node V5a is updated according to a value M of the first mapped data Fn1.

Since the variable nodes V2a, V6a and V7a have a value of 0, they cannot receive a message. Thus, the variable nodes V2a, V6a and V7a are not updated.

In FIG. 15, updating method of variable nodes V1b~V7b of second row is illustrated. Among the check nodes C1a~C3a corresponding to the first variable node V1b, check nodes having a value of 0 cannot transmit a message. Thus, updating of the first variable node V1b is performed according to the check node C1a transmitting a message and a value of –M of the first mapped data Fn1. Updating of the first variable node V1b is performed according to the mathematical formula 8. An operation result of the mathematical formula 8 is updated to a new value (or message) of the first variable node V1b.

In the same manner, the variable node V2b is updated according to a message transmitted from the check node C3b and a value M of the first mapped data Fn1. The variable node V4b is updated according to messages transmitted from the check nodes C1d and C3d and a value –M of the first mapped data Fn1. The variable node V6b is updated according to a value M of the first mapped data Fn1.

In the same manner, updating of variable nodes of third row is performed.

As described with reference to FIGS. 14 and 15, when a specific variable node is updated, the sum of message of the rest variable nodes except check node on the same location with the specific variable node among check nodes of the same column with the specific variable node and a value of the first mapped data Fn1 is updated to a value (or message) of the specific variable node.

As illustrated in FIG. 7, after updating (S350) of variable nodes is performed, a tentative decoding and a parity check (S360) are performed. The tentative decoding is performed according to the mathematical formula 9 on the basis of the posteriori probability Zn. A result of the tentative decoding is decoded data $\hat{C}$.

$$\hat{C} = [\hat{C}n], \hat{C}n = \begin{cases} 1, Zn \geq 0 \\ 0, Zn < 0 \end{cases} \quad \text{[mathematical formula 9]}$$

If posteriori probability Zn of specific location has a positive value, decoded data $\hat{C}$ of the corresponding location is distinguished to be '1'. If posteriori probability Zn of specific location has a negative value, decoded data $\hat{C}$ of the corresponding location is distinguished to be '0'.

After that, a parity check is performed according to a result of tentative decoding. The parity check is performed according to a mathematical formula 10 on the basis of the decoded data $\hat{C}$ and a parity check matrix.

$$H\hat{C} = 0 \quad \text{[mathematical formula 10]}$$

When the decoded data $\hat{C}$ and the parity check matrix satisfy the mathematical formula 10, the decoded data $\hat{C}$ is correctly decoded and the parity check is distinguished to succeed. That is, the hard decision HD is distinguished (S260) to succeed.

When the decoded data $\hat{C}$ and the parity check matrix don't satisfy the mathematical formula 10, the decoded data $\hat{C}$ is not correctly decoded and the parity check is distinguished to fail. After that, a next loop of the hard decision HD is performed or the soft decision SD is performed.

Figure 16:
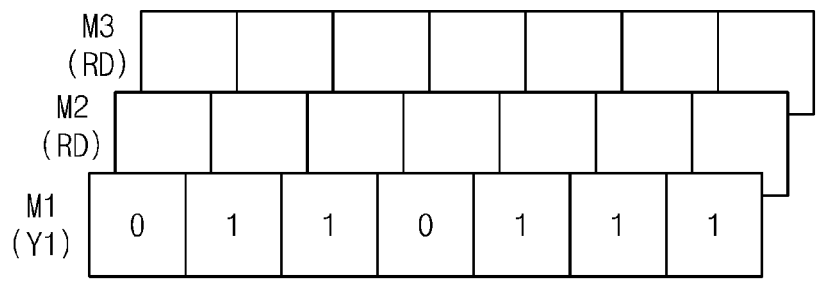
FIG. 16 is a drawing illustrating an example of a read and reliability information memory.

FIG. 16 is a drawing illustrating an example of a read and reliability information memory 310. Referring to FIGS. 3 and 16, the read and reliability information memory 310 includes a first storage region M1 storing the first read data Y1, a second storage region M2 storing reliability data RD and a third storage region M3.

Each bit of the reliability data RD has reliability of bit of the first read data Y1 on the same location.

The read and reliability information memory 310 manages the reliability data RD according to FIFO (First-In First-Out). When the read and reliability information memory 310 stores reliability data RD corresponding to the maximum or reference value and new reliability data RD is generated, the read and reliability information memory 310 may delete the oldest reliability data RD and may store the new reliability data RD.

When the soft decision SD is performed, the second and third storage regions M2 and M3 may be identical to storage regions storing data additionally read. If the storage regions storing additional data are used to store reliability data RD when the soft decision SD is performed, additional storage regions for storing the reliability data RD are not required.

Figure 17:
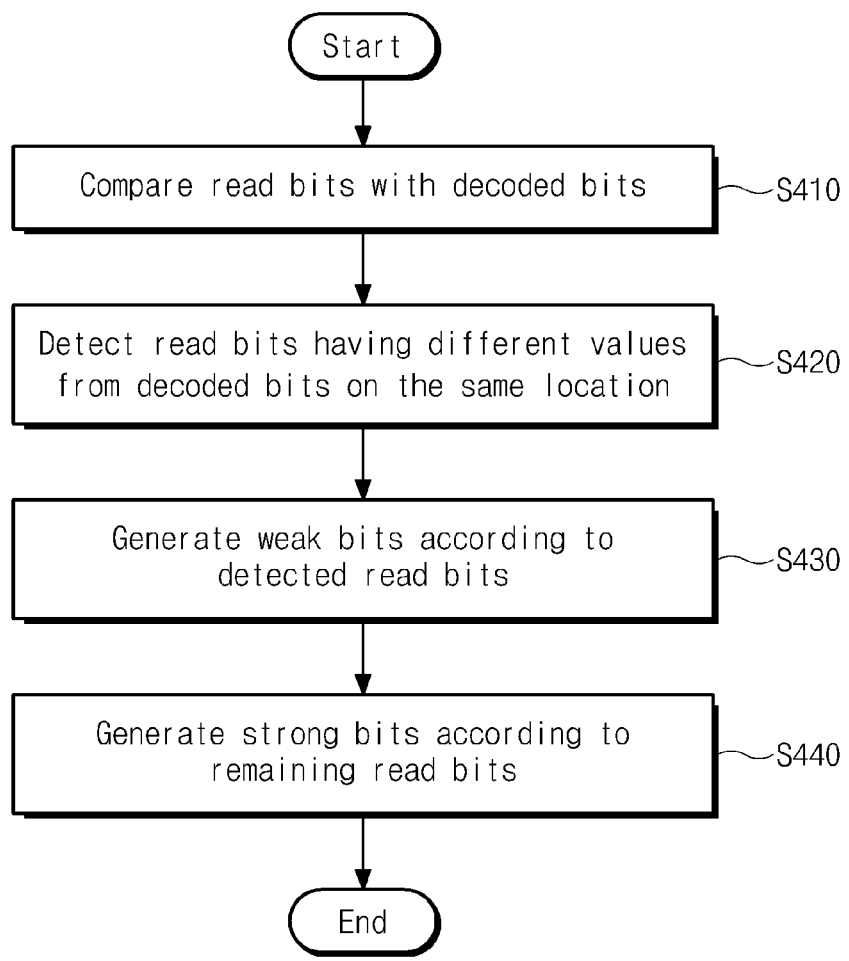
FIG. 17 is a flow chart illustrating a method of generating reliability bits in more detail.

FIG. 17 is a flow chart illustrating a method (S397 of FIG. 7) of generating reliability bits in more detail. Referring to FIG. 17, in S410, read bits of the first read data Y1 and decoded bits of the decoded data $\hat{C}$ are compared. Read bit and decoded bit on the same location are compared.

In S420, on the corresponding location, read bits having different values from the decoded bits are detected. If a value of kth bit of the first read data Y1 is '1' and a value of kth bit of the decoded data $\hat{C}$ is '0', kth bit is detected.

In S430, weak reliability bits are generated according to the detected read bits. When '0' is a weak reliability bit indicating that reliability of the read bit is low, reliability bits corresponding to the read bits detected in the S420 is '0'.

In S440, strong reliability bits are generated according to the rest read bits. When '1' is a strong bit indicating that reliability of the read bit is high, reliability bits corresponding to read bits not detected in the S420 are '1'. The S430 and the S440 may be performed at the same time.

Figure 18:
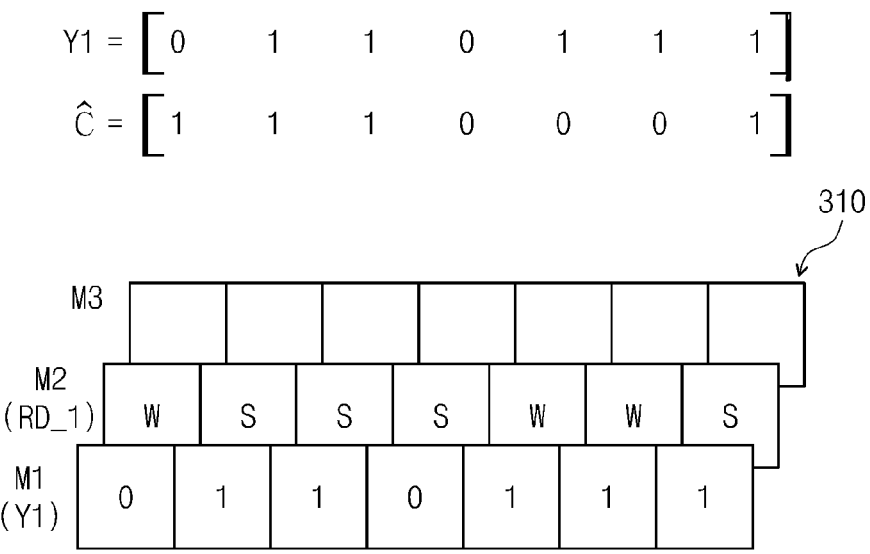
FIGS. 18 and 19 illustrate a process in which reliability bits are generated.
Figure 19:
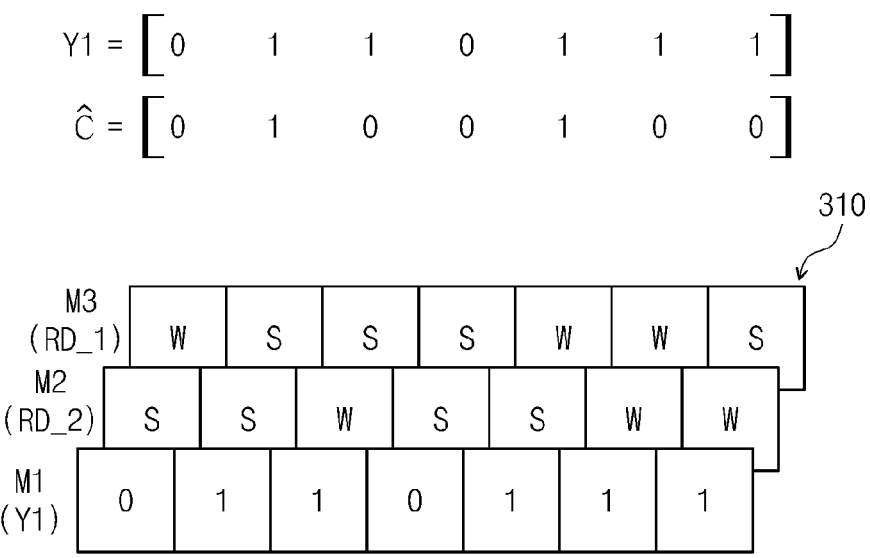

FIGS. 18 and 19 illustrate a process in which reliability bits are generated. In FIG. 18, a case that a first decoding loop is performed is illustrated. First reliability bits RD_1 are generated by comparing the first read data Y1 and the decoded data $\hat{C}$. The first reliability bits RD_1 are stored in the second storage region M2.

First, fifth and sixth bits of the first read data Y1 have different values from first, fifth and sixth bits of the decoded data $\hat{C}$. Thus, the first, fifth and sixth bits of the first reliability bits RD_1 are generated to weak reliability bits (e.g., '0').

Second, third, fourth and seventh bits of the first read data Y1 have the same values as second, third, fourth and seventh bits of the decoded data $\hat{C}$. Thus, the second, third, fourth and seventh bits of the first reliability bits RD_1 are generated to strong reliability bits (e.g., '1').

In FIG. 19, a case that a second decoding loop is performed is illustrated. The reliability bits generated in the first decoding loop are transferred from the second storage region M2 to the third storage region M3. Reliability bits generated in the second decoding loop are stored in the second storage region M2.

Third, sixth and seventh bits of the first read data Y1 have different values from third, sixth and seventh of the decoded data $\hat{C}$. Thus, the third, sixth and seventh bits of first reliability bits RD_2 are generated to weak reliability bits (e.g., '0').

First, second, fourth and fifth bits of the first read data Y1 have the same values as first, second, fourth and fifth bits of the decoded data $\hat{C}$. Thus, the first, second, fourth and fifth bits of the first reliability bits RD_2 are generated to strong reliability bits (e.g., '1').

When the strong reliability bit is '1' and the weak reliability bit is '0', the third read data Y3 is arranged in the form of mathematical formula 11.

$$Y3=[010\ 111\ 101\ 011\ 110\ 100\ 101] \quad \text{[mathematical formula 11]}$$

A first bit of each element of the third read data Y3 is each bit of the first read data Y1. A second bit of each element of the third read data Y3 is a reliability bit generated from the decoding loop most recently performed. A third bit of each element of the third read data Y3 is a reliability bit generated from the decoding loop performed just before the most recent decoding loop is performed.

Similar to the second read data Y2 used when performing the soft decision SD, the third read data Y3 includes additional information indicating reliability of each bit of the first read data Y1. Since the third read data Y3 has 8 patterns, it may be mapped to much more log-likelihood ratios (LLR) and thereby accuracy of hard decision decoding is improved.

FIG. 20 illustrates an example of mapped information stored in hard decision log-likelihood ratio (LLR) register 321. When the first read data Y1 is received, the hard decision log-likelihood ratio (LLR) register 321 outputs two log-likelihood ratios (LLR) M and −M as mapped information as described above. When the third read data Y3 is received, the hard decision log-likelihood ratio (LLR) register 321 outputs mapped information illustrated in FIG. 20.

Elements having low reliability, that is, elements including weak reliability bits are mapped to have lower log-likelihood ratio (LLR). Elements having high reliability, that is, elements including strong reliability bits are mapped to have higher log-likelihood ratio (LLR).

Log-likelihood ratios (LLR) M1~M8 are set to increase an effect of reliability data RD most recently generated.

If the mapped information of FIG. 20 is mapped to the third read data Y3 of mathematical formula 11, the third mapped data Fn3 is a mathematical formula 12.

$$Fn3=[M3\ M8\ M6\ M4\ M7\ M5\ M6] \quad \text{[mathematical formula 12]}$$

Each log-likelihood ratio (LLR) has a positive value or a negative value.

Figure 21:
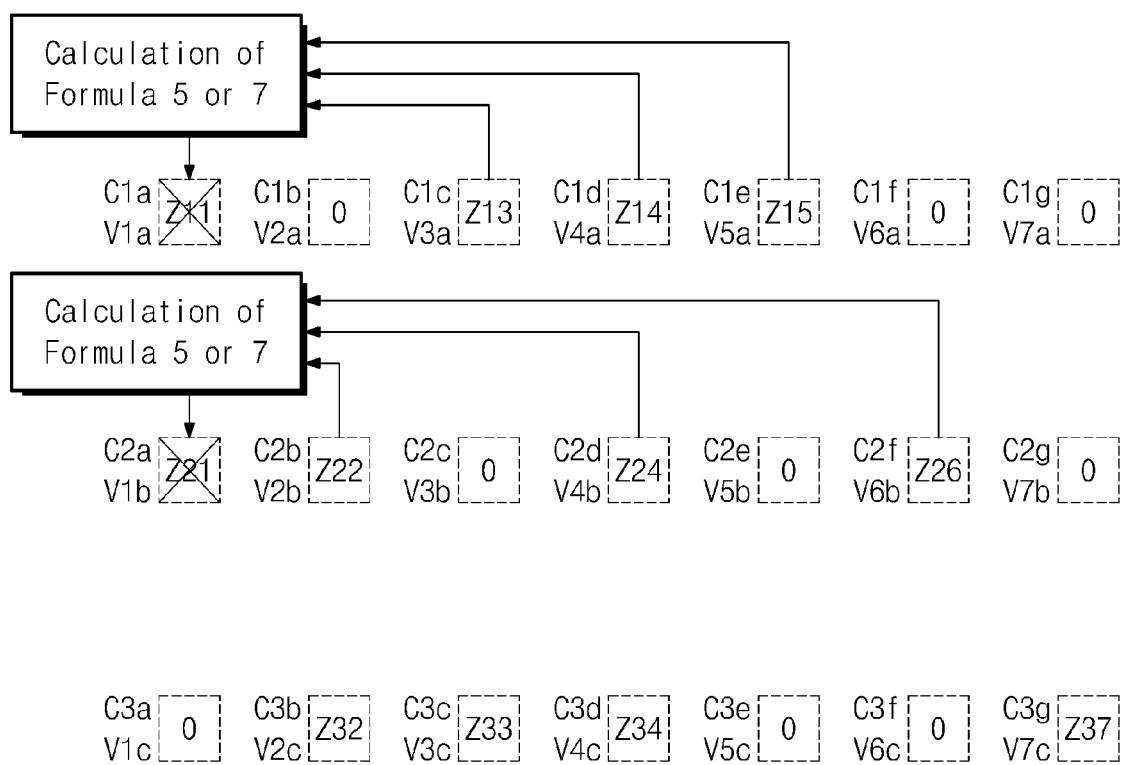
FIG. 21 illustrates a method that check nodes are updated.

FIG. 21 illustrates a method that check nodes are updated (S340). Updating method of check nodes of when each log-likelihood ratio (LLR) remapping condition is satisfied is illustrated in FIG. 21. Referring to FIG. 21, check nodes receive messages from variable nodes which are not on the same location as the check nodes among variable nodes on the same row and are updated according to the received message. Since the third mapped data Fn3 to which log-likelihood ratio (LLR) is remapped is not used, updating of the check nodes is performed by the same manner as the method described with reference to FIGS. 10 through 12.

Figure 22:
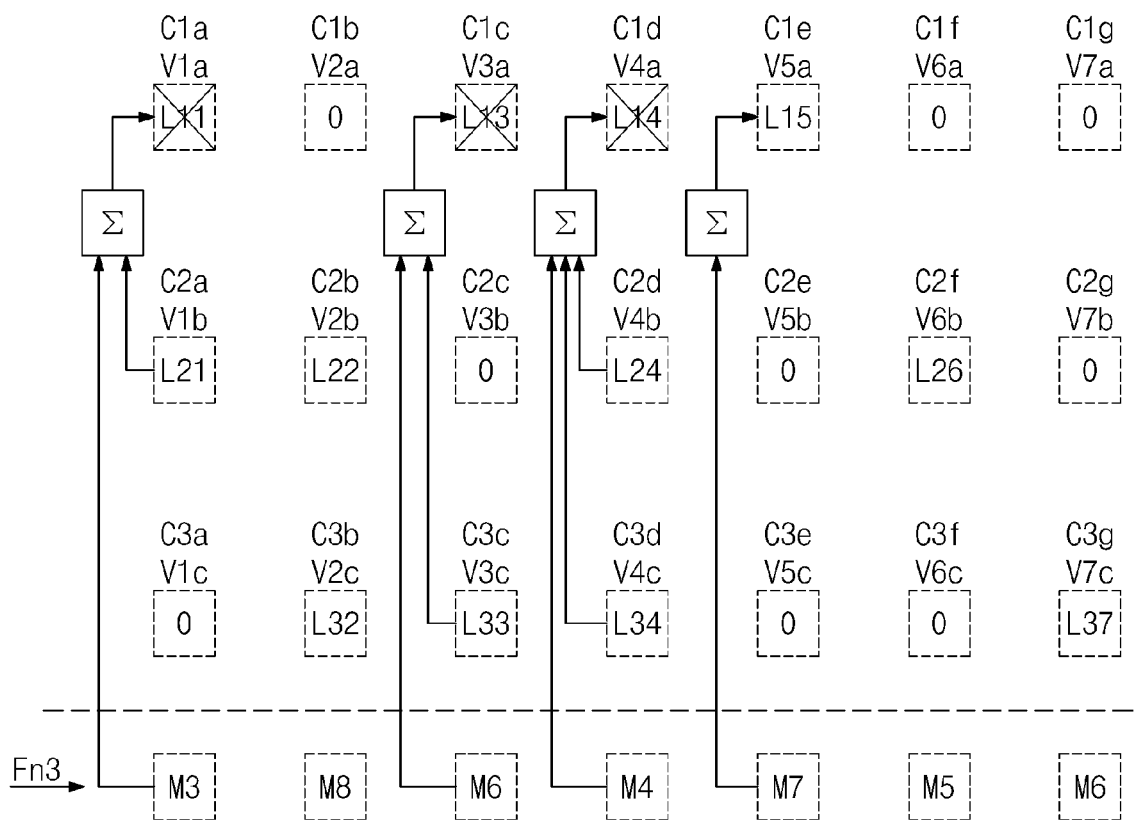
FIG. 22 illustrates a method that variable nodes are updated.

FIG. 22 illustrates a method that variable nodes are updated (S350). Variable nodes receive messages from variable nodes which are not on the same location as check nodes and elements of the third mapped data Fn3 on the same location as the check nodes among the check nodes on the same column and are updated according to the received messages. Updating of check nodes is performed in the same manner as the method described with reference to FIGS. 13 through 15 except that the third mapped data Fn3 to which various log-likelihood ratios (LLR) M1~M8 are remapped is used.

As described above, the error correction code decoder 300 in accordance with at least some example embodiments decodes the first read data Y1 read once from the storage device 100 to generate reliability data RD. Log-likelihood ratios (LLR) are remapped on the basis of the third read data Y3 which is combination of the first read data Y1 and the reliability data RD. Elements having low reliability are mapped to have low log-likelihood ratios (LLR) and elements having high reliability are mapped to have high log-likelihood ratios (LLR). When low density parity check (LDPC) decoding is performed, an element having low log-likelihood ratios (LLR) has a small effect on other elements. An element having high likelihood ratios (LLR) has a great effect on other elements.

That is, according at least some example embodiments, an effect of element having low reliability is reduced and an effect of element having high reliability increases. Thus, accuracy of the low density parity check (LDPC) decoding, that is, the hard decision decoding is improved.

In the embodiments described above, reliability bit of 2 bits is provided to one bit of the first read data Y1. However, the number of reliability bits provided to one bit of the first read data Y1 is not limited.

In the embodiments described above, the error correction code decoder 300 is a constituent element of the storage system 1000. However, the error correction code decoder 300 is not limited to be used in the storage system 1000. The error correction code decoder 300 is variously used in an environment in which an error occurs in data.

A soft decision SD is performed similar to the method illustrated in FIG. 7. The soft decision SD is performed in the same manner as that illustrated in FIG. 7 except that the log-likelihood ratios (LLR) remapping step (S320 and S330) and a generation step (S397) of reliability bit are removed, the S380 is substituted with soft decision success, the S393 is substituted with soft decision fail, and reading error step (S170) is performed after the soft decision fail.

Log-likelihood ratios (LLR) used when the soft decision SD is performed is mapped to the first read data Y1 and the reliability data RD. That is, log-likelihood ratios (LLR) being remapped in the S330 and log-likelihood ratios (LLR) being mapped when the soft decision SD is performed may be the same.

When decoding is repeatedly performed, values of nodes calculated in the previous decoding loop are used in a next decoding loop.

Figure 23:
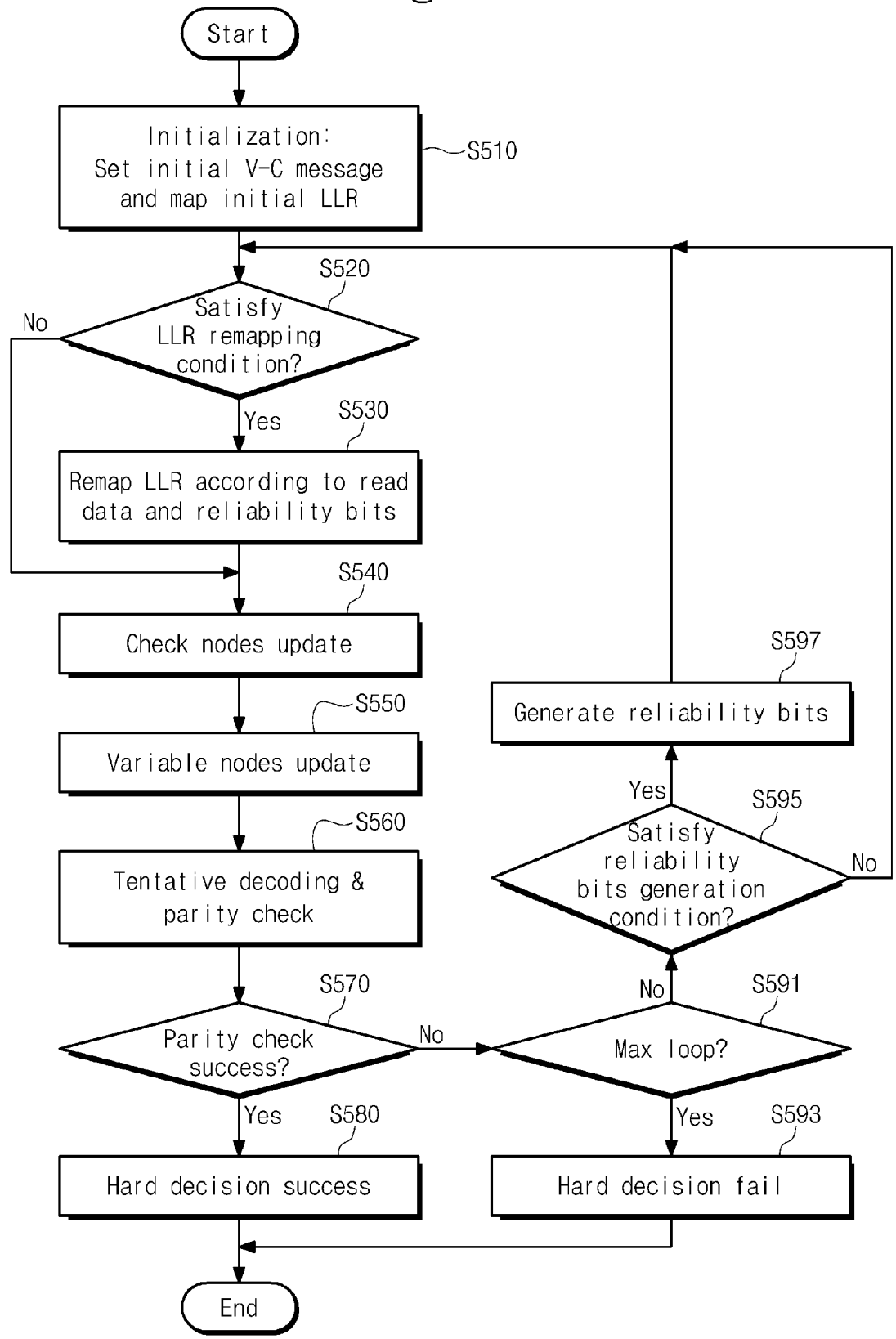
FIG. 23 is a flow chart illustrating another example of a method of performing a decoding.

FIG. 23 is a flow chart illustrating another example of a method of performing a decoding.

If comparing that with the decoding method of FIG. 7, a step (S595) of distinguishing whether a reliability bit generation condition is satisfied is added between a step (S591) of distinguishing the maximum or reference loop and a step (S597) of generating reliability bit.

The reliability bit generation condition includes the number of times decoding is performed. When decoding loop of the first n number of times is performed, reliability bits are not generated and reliability bits are generated from just after the n number of times is performed. Thus, an initial decoding result having relatively low reliability is ignored and reliability bits are generated according to a decoding result having relatively high reliability of after the middle stage.

Figure 24:
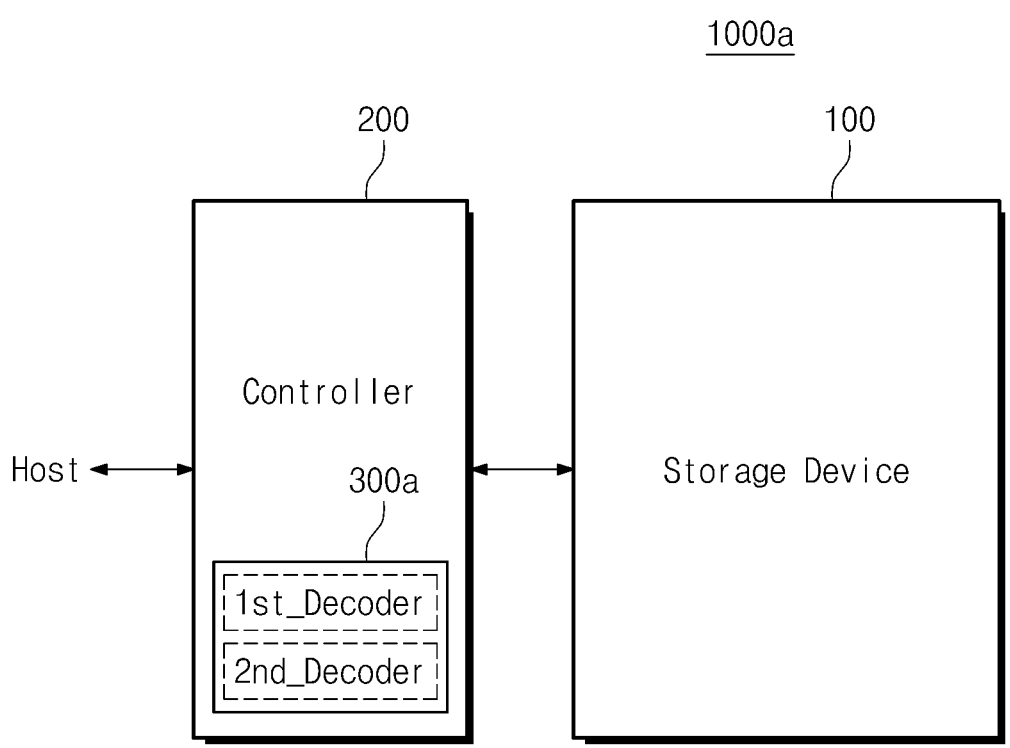
FIG. 24 is a block diagram illustrating another example of the storage system of FIG. 1.

FIG. 24 is a block diagram illustrating another example of the storage system 1000 of FIG. 1. Referring to FIG. 24, an error correction code decoder 300a includes a first decoder and a second decoder. The first decoder uses a different decoding method from the second decoder. The first decoder corrects an error using a bose-chaudhuri-hocquenghem (BCH) code. The second decoder corrects an error using low density parity check (LDPC). The first decoder corrects an error of meta data having a relatively low capacity. The second decoder corrects an error of user data having a relatively high capacity.

Figure 25:
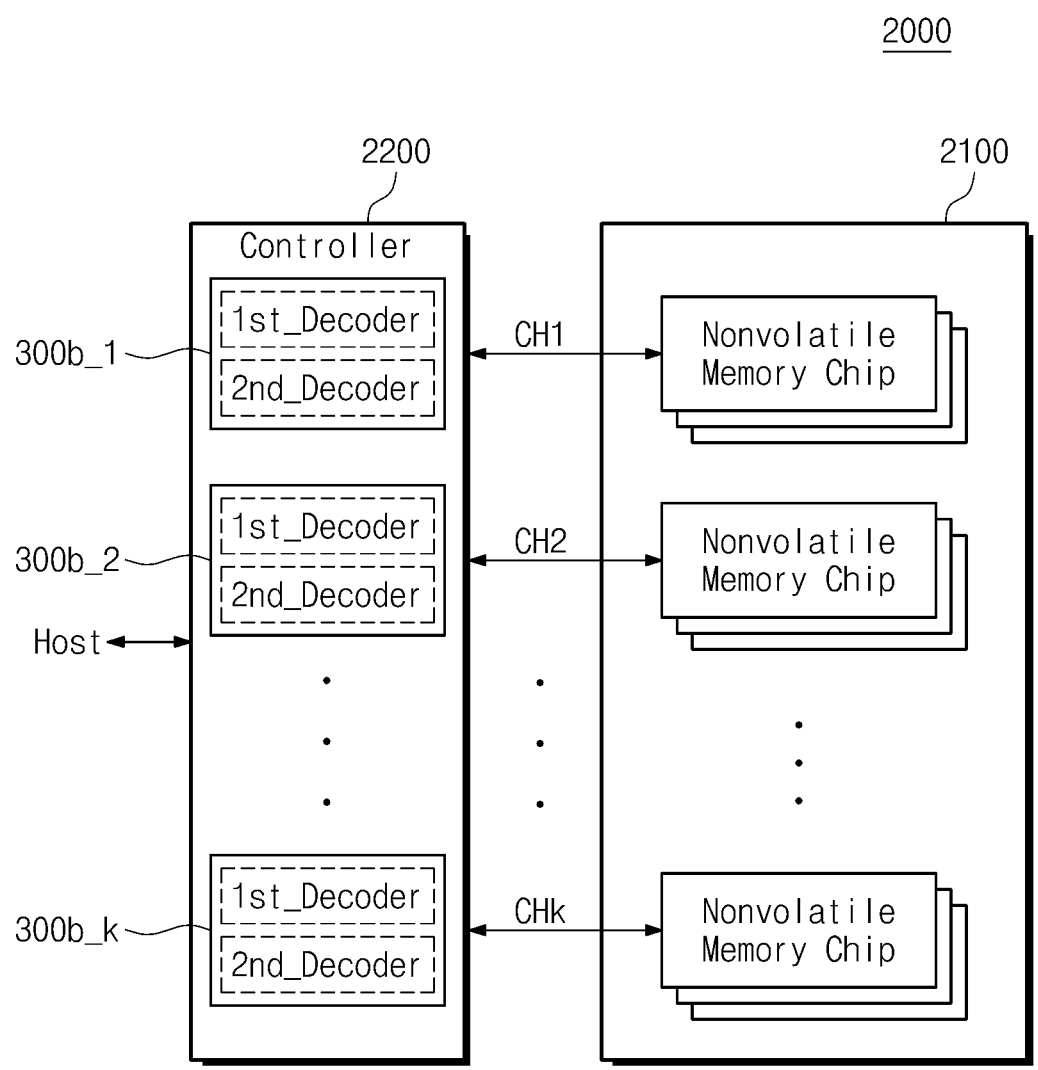
FIG. 25 is a block diagram an application example of the storage system of FIG. 1.

FIG. 25 is a block diagram an application example of the storage system 1000 of FIG. 1. Referring to FIG. 25, a storage system 2000 includes a nonvolatile memory device 2100 and a controller 2200. The nonvolatile memory device 2100 includes a plurality of nonvolatile memory chips. The plurality of nonvolatile memory chips is divided into a plurality of groups. Each group of the plurality of nonvolatile memory chips is configured to communicate with the controller 2200 through one common channel. It is illustrated that the plurality of nonvolatile memory chips is configured to communicate with the controller 220 through first through kth channels CH1~CHk.

The controller 2200 includes error correction code decoders 300b_1~300b_k described with reference to FIG. 3. The error correction code decoders 300b_1~300b_k correct errors of data read from the nonvolatile memory device 2100.

The error correction code decoders 300b_1~300b_k are provided as many as the number corresponding to the number of channels CH1~CHk. One error correction code decoder corrects errors of the nonvolatile memory chips connected to one channel.

One error correction code decoder includes a first decoder and a second decoder. The first and second decoders us different decoding method from each other. The first decoder corrects an error using a bose-chaudhuri-hocquenghem (BCH) code. The second decoder corrects an error using low density parity check (LDPC). The first decoder corrects an error of meta data having a relatively low capacity. The second decoder corrects an error of user data having a relatively high capacity.

In FIG. 25, it is illustrated that the plurality of nonvolatile memory chips is connected to one channel. However, the storage system 2000 may be changed so that one nonvolatile memory chip is connected to one channel.

Figure 26:
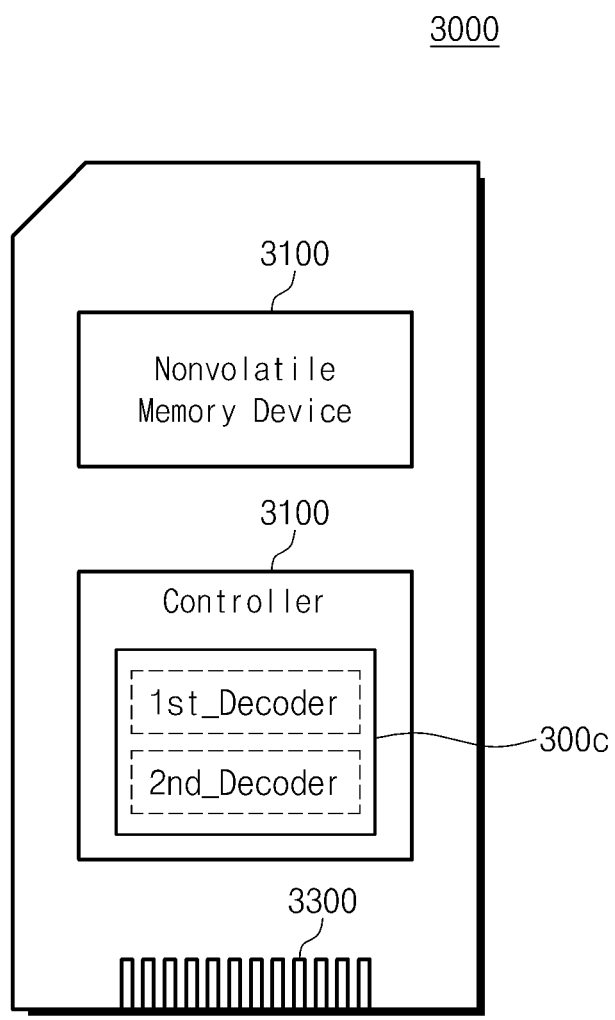
FIG. 26 is a memory card in accordance with at least some example embodiments.

FIG. 26 is a memory card 3000 in accordance with at least some example embodiments. Referring to FIG. 26, the memory card 3000 includes a nonvolatile memory device 3100, a controller 3200 and a connector 3300.

The controller 3200 includes the error correction code decoder 300c described with reference to FIG. 3. The error correction code decoder 300c corrects an error of data read from the nonvolatile memory device 3100.

The error correction code decoder 300c includes a first decoder and a second decoder. The first and second decoders us different decoding method from each other. The first decoder corrects an error using a bose-chaudhuri-hocquenghem (BCH) code. The second decoder corrects an error using low density parity check (LDPC). The first decoder corrects an error of meta data having a relatively low capacity. The second decoder corrects an error of user data having a relatively high capacity.

The connector 3300 electrically connects the memory card 3000 and a host.

The memory card 3000 may include a personal computer memory card international association (PCMCIA) card, a compact flash (CF) card, a smart media (SM, SMC) card, a memory stick, a multimedia (MMC, RS-MMC, MMCmicro) card, a SD card (SD, miniSD, microSD, SDHC), a universal flash memory device UFS, etc.

Figure 27:
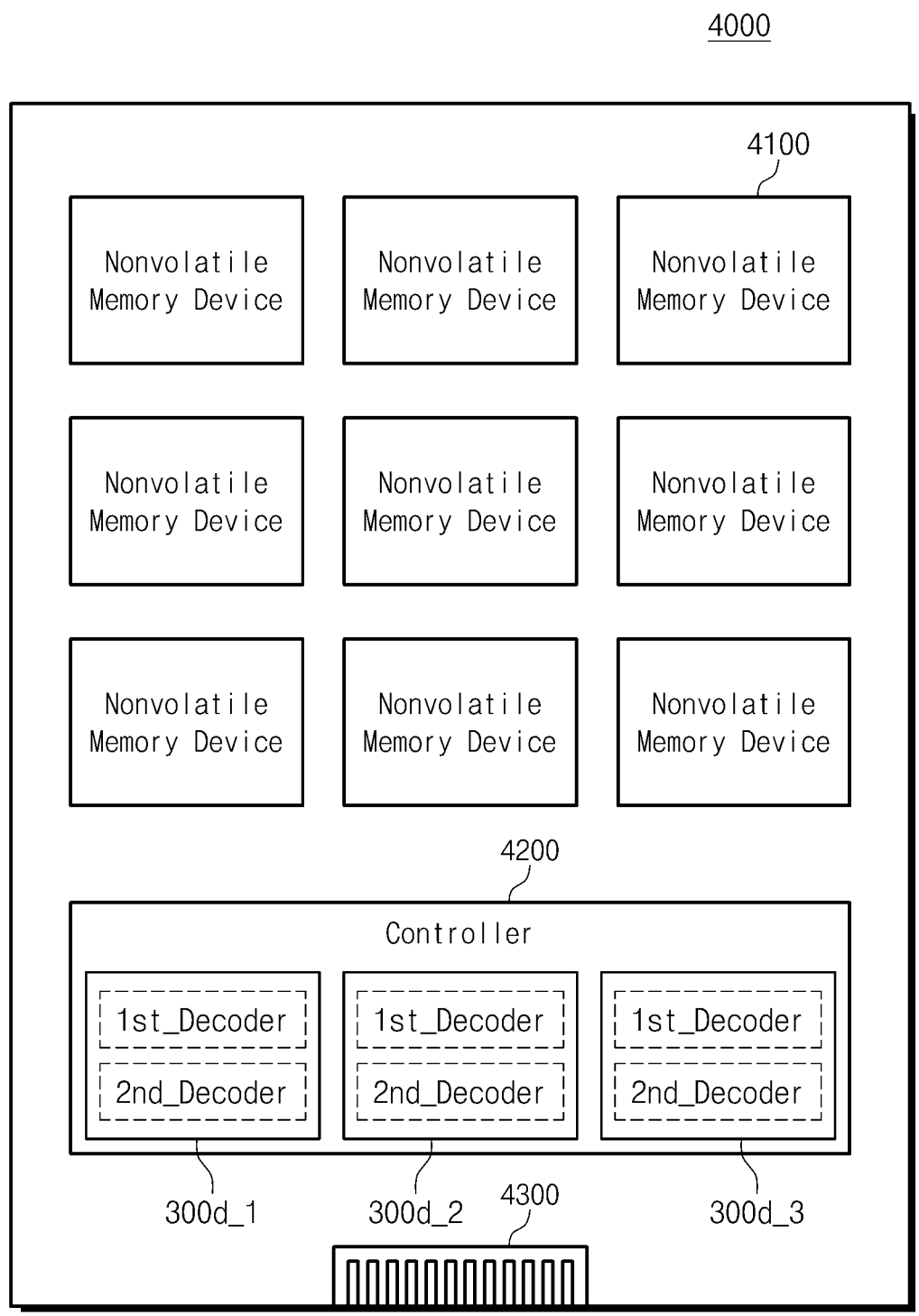
FIG. 27 is a solid state drive in accordance with at least some example embodiments.

FIG. 27 is a solid state drive 4000 in accordance with at least some example embodiments. Referring to FIG. 27, the solid state drive 4000 includes a plurality of nonvolatile memory devices 4100, a controller 4200 and a connector 4300.

The controller 4200 includes error correction code decoders 300d_1~300d_3 described with reference to FIG. 3. The error correction code decoders 300d_1~300d_3 correct errors of data read from the nonvolatile memory device 3100.

The error correction code decoders 300d_1~300d_3 are provided as many as the number corresponding to the number of channels. One error correction code decoder corrects errors of the nonvolatile memory chips connected to one channel.

One error correction code decoder includes a first decoder and a second decoder. The first and second decoders us different decoding method from each other. The first decoder corrects an error using a bose-chaudhuri-hocquenghem (BCH) code. The second decoder corrects an error using low density parity check (LDPC). The first decoder corrects an error of meta data having a relatively low capacity. The second decoder corrects an error of user data having a relatively high capacity.

The connector 4300 electrically connects the solid state drive 4000 and a host.

Figure 28:
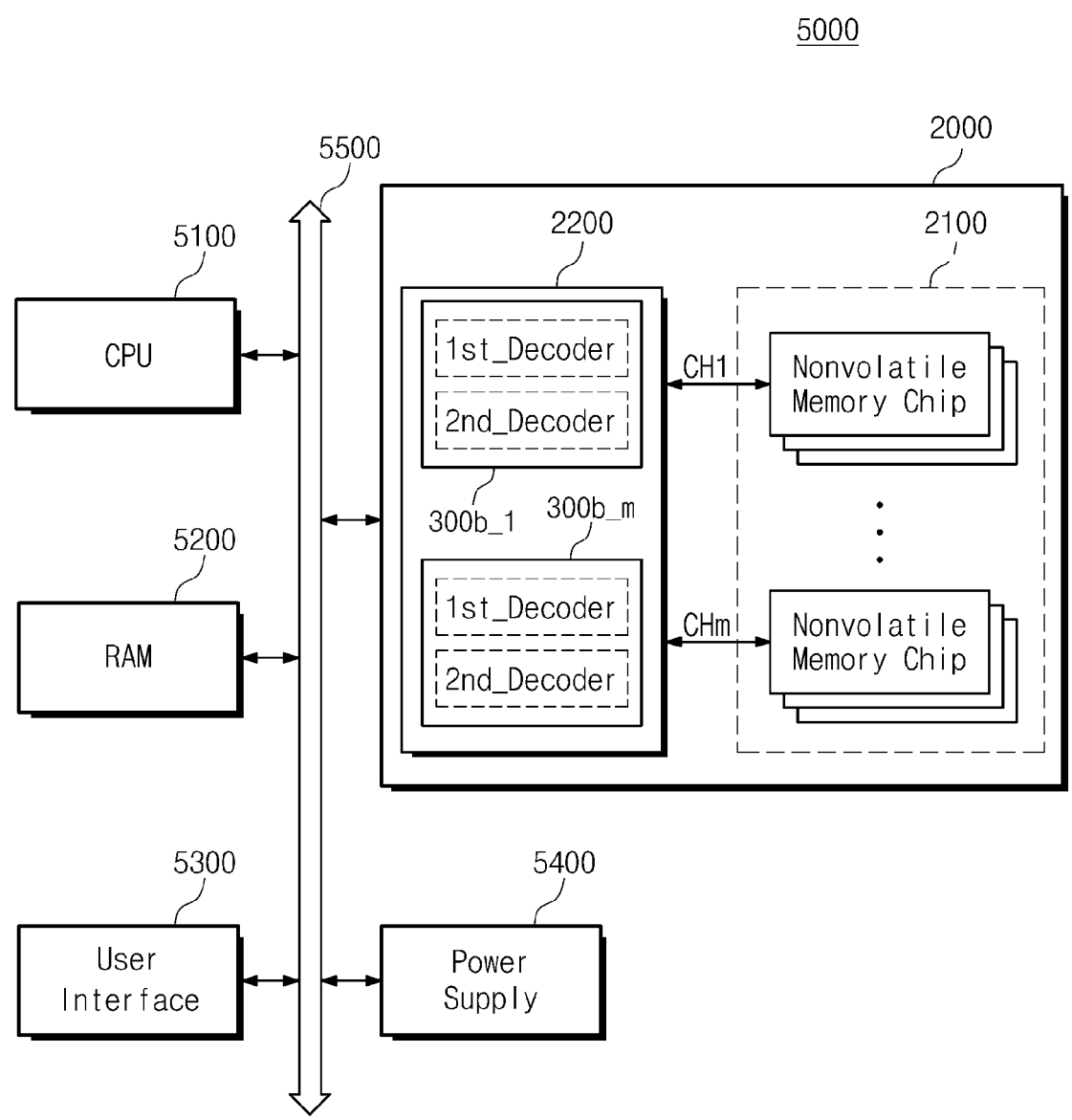
FIG. 28 is a block diagram illustrating a computing system including the storage system described with reference to FIG. 25.

FIG. 28 is a block diagram illustrating a computing system 5000 including the storage system described with reference to FIG. 25. Referring to FIG. 28, the computing system 5000 includes a central processing device 5100, a RAM 5200, a user interface 5300, a power supply 5400 and a storage system 2000.

The storage system 2000 is coupled to the central processing device 5100, the RAM 5200, the user interface 5300 and the power supply 5400 through a system bus 5500. Data provided through the user interface 5300 or processed by the central processing unit 5100 is stored in the storage system 2000.

In FIG. 28, it is illustrated that the nonvolatile memory device 2100 is coupled to the system bus 5500 through the controller 2200. However, the nonvolatile memory device 2100 may be configured to be directly coupled to the system bus 5500.

In FIG. 28, it is illustrated that the storage system 2000 described with reference to FIG. 25 is provided. However, the storage system 2000 may include the storage system 1000 described with reference to FIGS. 1 and 24.

According to at least some example embodiments, a hard decision is performed on the basis of read data and reliability data. Reliability of the hard decision is improved and thereby the frequency that a soft decision occurs is reduced. Thus, a storage system is provided which includes a method of reading data from a storage device having improved reliability and consuming less resource, an error correction device and an error correction code decoder.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of reading data from a storage device comprising:
    reading first data stored in the storage device using first read voltages;
    performing a first low density parity check (LDPC) decoding based on the first data;
    generating reliability bits of each of read bits according to the decoding result, the read bits being bits of the first data; and
    performing a second LDPC decoding based on the first data and the reliability bits to perform a first error correction on the first data, when the reliability bits are generated a reference number of times, the reference number of times being greater than 2,
    the generating the reliability bits including,
        generating decoded bits as a result of the first LDPC decoding;
        comparing each of a plurality of first bits with a corresponding one of a plurality of second bits to generate a comparing result, the first bits being bits of the read bits, the second bits being bits of the decoded bits; and
        generating the reliability bits corresponding to each of the plurality of first bits based on the comparing result.

2. The method of claim 1, wherein if a bit from among the plurality of first bits is the same as the corresponding bit from among the second bits, the generated reliability bit indicates that reliability of the first bit corresponding to the reliability bit is high.

3. The method of claim 1, wherein if a bit from among the plurality of the first bits is different from a corresponding bit from among the second bits, the generated reliability bit indicates that reliability of the first bit corresponding to the reliability bit is low.

4. The method of claim 1, wherein if the first LDPC decoding is performed, log-likelihood ratios having a same size and opposite sign are mapped to the read bits.

5. The method of claim 1, wherein if the second LDPC decoding is performed, two or more different log-likelihood ratios are remapped according to the read bits and the reliability bits.

6. The method of claim 1, further comprising:
    performing a second error correction by, if an error correction is not completed in the first error correction, rereading the data stored in the storage device using fractional read voltages and performing a third LDPC decoding based on the first data and the reread data.

7. The method of claim 6, wherein levels of the read voltages are different from levels of the fractional read voltages.

8. The method of claim 1, wherein after a decoding loop of the first LDPC decoding is performed a reference number of times, the reliability bits are generated whenever the decoding loop of the first LDPC decoding is repeated.

9. The method of claim 1, wherein if the number of the generated reliability bits reaches a reference value, the removal of bits from among the reliability bits is managed in the form of first-in first-out (FIFO).

10. The method of claim 1, wherein after a decoding loop of the first LDPC decoding is performed as many as a first reference number of times after a number of the generated reliability bits reaches a second reference value, the second LDPC decoding is performed.

11. The method of claim 1, wherein when the second LDPC decoding is performed, check nodes and variable nodes operated in the first LDPC decoding are updated.

12. A method of reading data from a storage device comprising:
    performing a hard decision reading operation to generate hard decision data, the hard decision reading operation including,
        reading first data stored in the storage device using first read voltages,
        generating a plurality of reliability bits corresponding to each of a plurality of read bits by performing a decoding operation based on the first data, the read bits being bits of the first data, and
        performing a first error correction operation on the first data based on the first data and the reliability bits when the reliability bits are generated a reference number times, the reference number of times being greater than 2;
    generating a comparison result based on the hard decision data; and
    determining whether to perform a soft decision reading operation on the data stored in the storage device using fractional read voltages different than the first read voltages, based on the comparison result, the performing the first decoding operation including generating decoded bits, and the generating the plurality of reliability bits including generating a comparison result by comparing each of a plurality of first bits with a corresponding one of a plurality of second bits, the first bits being bits of the read bits, the second bits being bits of the decoded bits, the reliability bits being the comparison result.

13. The method of claim 12, wherein the decoding operation is a low density parity check (LDPC) decoding operation, the comparison result is generated by performing a parity check, and the determining includes determining to perform the soft decision reading operation if the parity check fails.

14. The method of claim 1, further comprising:

generating combined data by combining the first bits with the reliability bits such that the combined data includes the first bits and the reliability bits, the second LDPC decoding being performed on the combined data.

15. The method of claim 14, wherein generating the combined data includes generating, as the combined data, a string of bits, the string of bits including a plurality of consecutive groups of bits, each of the plurality of consecutive groups of bits including at least a first member bit and a second member bit, the first member bit being a bit from among the first bits, the second member bit being the bit, from among the reliability bits, that corresponds to the bit from among the first bits.

16. The method of claim 12, further comprising:

generating combined data by combining the first bits with the reliability bits such that the combined data includes the first bits and the reliability bits, the first error correction operation being performed on the combined data.

17. The method of claim 16, wherein generating the combined data includes generating, as the combined data, a string of bits, the string of bits including a plurality of consecutive groups of bits, each of the plurality of consecutive groups of bits including at least a first member bit and a second member bit, the second member bit being adjacent to the first member bit, the first member bit being a bit from among the first bits, the second member bit being the bit, from among the reliability bits, that corresponds to the bit from among the first bits.

* * * * *